United States Patent
Behnke

(10) Patent No.: US 9,328,427 B2
(45) Date of Patent: May 3, 2016

(54) EDGELESS PULSE PLATING AND METAL CLEANING METHODS FOR SOLAR CELLS

(71) Applicant: Joseph Behnke, San Jose, CA (US)

(72) Inventor: Joseph Behnke, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 884 days.

(21) Appl. No.: 13/630,546

(22) Filed: Sep. 28, 2012

(65) Prior Publication Data

US 2014/0090982 A1    Apr. 3, 2014

(51) Int. Cl.
| | |
|---|---|
| *C25D 5/48* | (2006.01) |
| *C25D 5/18* | (2006.01) |
| *C25D 5/10* | (2006.01) |
| *C25D 7/12* | (2006.01) |
| *H01L 31/0224* | (2006.01) |

(52) U.S. Cl.
CPC .. *C25D 5/10* (2013.01); *C25D 5/18* (2013.01); *C25D 5/48* (2013.01); *C25D 7/126* (2013.01); *H01L 31/022441* (2013.01)

(58) Field of Classification Search
CPC ............ C25D 5/18; C25D 5/48; C25D 7/126; H01L 31/022441; H01L 31/022425
See application file for complete search history.

(56) References Cited

U.S. PATENT DOCUMENTS

| | | | | |
|---|---|---|---|---|
| 4,609,565 A | * | 9/1986 | Yates | C23C 28/00 |
| | | | | 136/256 |
| 8,212,259 B2 | * | 7/2012 | Flynn | C30B 23/00 |
| | | | | 257/615 |
| 2009/0134034 A1 | * | 5/2009 | Pass | C25D 17/001 |
| | | | | 205/136 |

* cited by examiner

*Primary Examiner* — Bryan D. Ripa

(74) *Attorney, Agent, or Firm* — Blakely Sokoloff Taylor Zafman LLP

(57) ABSTRACT

A method for plating metal to a solar cell is disclosed. The method includes plating a metal layer only on the surface of solar cell without plating metal along the solar cell edges by conducting a first current in a first direction in an electroplating bath, ejecting metal from the metal layer by conducting a second current in a second direction and plating additional metal to the metal layer by conducting a third current in the first direction. The first, second and third current can be alternated. Subsequent to an electroplating process, an ultrasonic cleaning process is performed on the solar cell to remove any excess plated metal along the surface and edges of the solar cell.

19 Claims, 26 Drawing Sheets

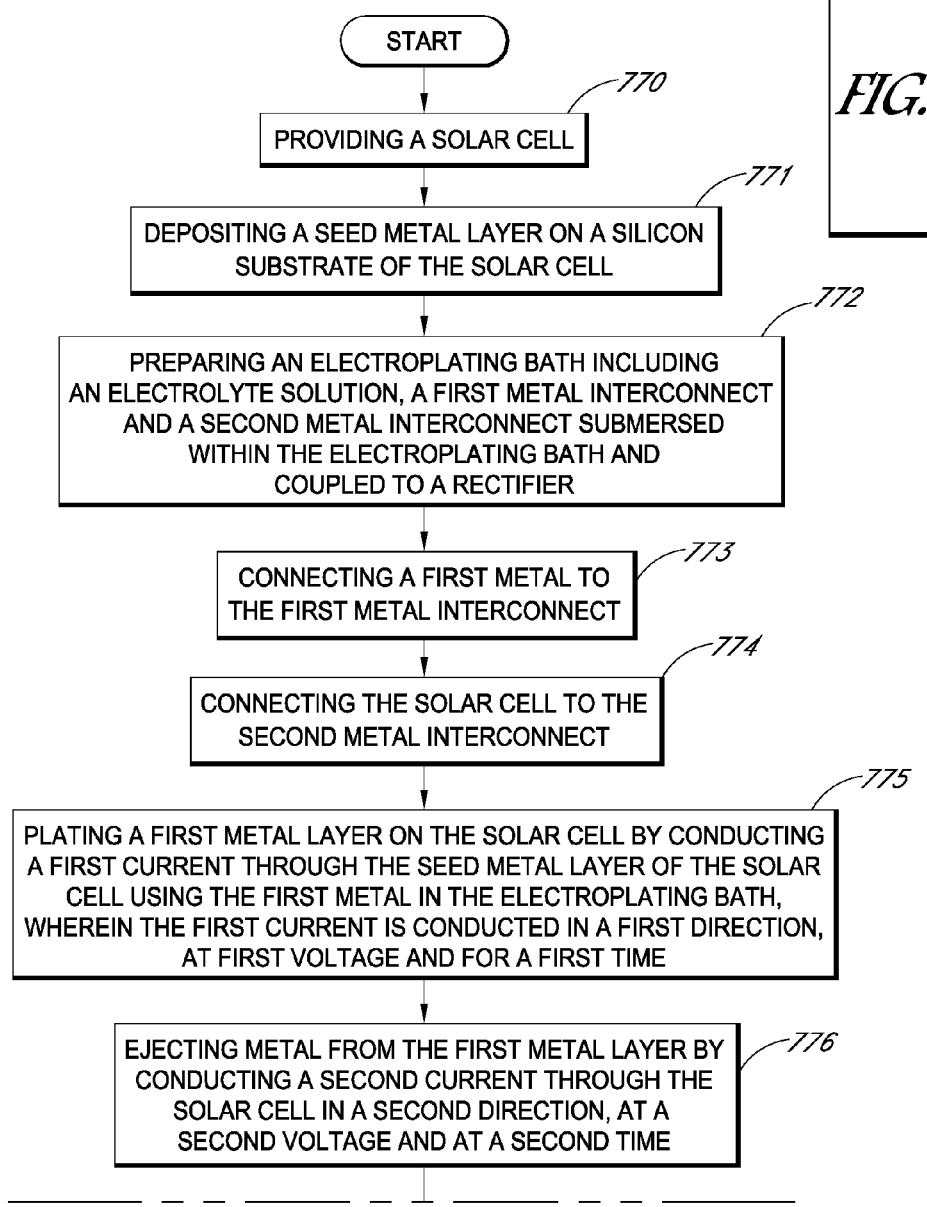

EDGELESS PULSE PLATING AND METAL CLEANING METHODS FOR SOLAR CELLS

TECHNICAL FIELD

Embodiments of the subject matter described herein relate generally to solar cells. More particularly, embodiments of the subject matter relate to solar cell structures and fabrication processes.

BACKGROUND

Solar cells are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Techniques for improving plating metal to and removing contaminants from a solar cell during manufacturing are very beneficial as these are an intrinsic part of the standard solar cell fabrication process. Such improved techniques may reduce fabrication steps and improve overall output yield, decreasing overall solar cell manufacturing time and increasing the available product yield due to less handling.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
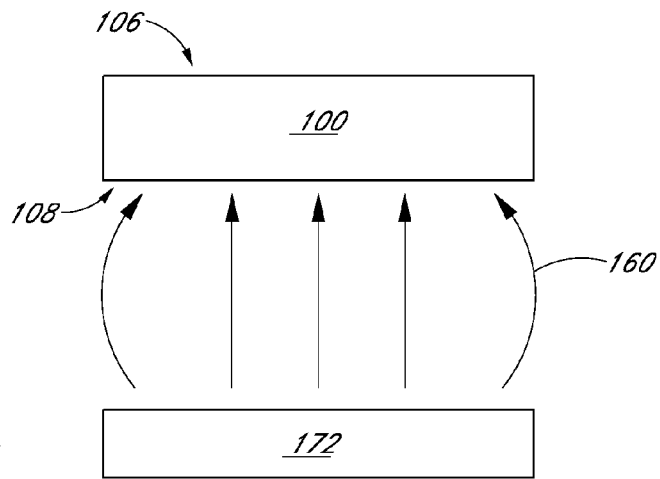
FIG. 1-5 are cross-sectional representations of a solar cell in accordance with a standard electroplating process for a solar cell.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Additionally, numerous specific details are set forth, such as specific process flow operations, in order to provide a thorough understanding of embodiments of the present inventions. It will be apparent to one skilled in the art that embodiments of the present inventions may be practiced without these specific details. In other instances, well-known fabrication techniques, such as lithographic, etch techniques and standard electroplating techniques, are not described in detail in order to not unnecessarily obscure embodiments of the present inventions. Furthermore, it is to be understood that the various embodiments shown in the figures are illustrative representations and are not necessarily drawn to scale.

A method of plating a metal layer on a solar cell is disclosed. The method includes providing a solar cell having a front side configured to face the sun during normal operation, a back side opposite the front side and four side edges. The method also includes providing a seed metal layer on a silicon substrate of the solar cell, plating a first metal layer on the solar cell, where plating the first metal layer is accomplished by conducting a first current through the seed metal layer using a metal in a bath, the conducting of the first current performed in a first direction, at first voltage, and at a first time. The method also includes ejecting metal from the first metal layer by conducting a second current through the solar cell in a second direction, at a second voltage, and at a second time. Subsequent to ejecting metal from the first metal layer, the method may further include plating additional metal on the first metal layer by conducting a third current at a third voltage, for a third time, in the first direction. In an embodiment, the resulting solar cell includes a metal plated on the solar cell with interdigitated metal contact fingers running on the back side, but not along the side edges, of the solar cell. In another embodiment, plating metal on the solar cell includes plating interdigitated metal contact fingers running on the front side, but not along the side edges, of the solar cell.

Another method of plating a metal layer on a solar cell is disclosed. The method includes providing a solar cell having a front side configured to face the sun during normal operation, a back side opposite the front side and four side edges. The method also includes providing a seed metal layer on a silicon substrate of the solar cell, plating a first metal layer on the solar cell, where plating the first metal layer is accomplished by conducting a first current through the seed metal layer using a metal in a bath, the conducting of the first current performed in a first direction, at first voltage, and at a first time. The method also includes disproportionately removing metal from at least one side edge or edge of the solar cell by conducting a second current through the solar cell, in a second direction, at a second voltage, and at a second time, where the second current can be in opposite polarity of the first current, the second time can be shorter than the first time, and the second voltage is at most 3 times greater than that of the first voltage. The plating and ejecting operations can be alternated throughout the plating process and subsequent to ejecting metal from the first metal layer. The method can further include plating additional metal on the first metal layer by conducting a third current, at a third voltage, for a third time in the first direction.

Still another method of plating a metal layer on a solar cell is disclosed. The method includes providing a solar cell having a front side configured to face the sun during normal operation, a back side opposite the front side and four side edges. The method also includes providing a seed metal layer on a silicon substrate of the solar cell, plating a first metal layer on the solar cell, where plating the first metal layer is accomplished by conducting a first current through the seed metal layer using a metal in a bath, the conducting of the first current performed in a first direction, at first voltage, and at a first time. The method includes disproportionally removing metals from regions of the solar cell without removing metals from the seed metal layer by conducting a second current through the solar cell in a second direction, at a second voltage, and at a second time. Subsequent to ejecting metal from the first metal layer, the method may further include plating additional metal on the first metal layer by conducting a third current, at a third voltage, for a third time in the first direction.

Yet another method of plating a metal layer on a solar cell is disclosed. The method includes providing a solar cell having a front side configured to face the sun during normal operation, a back side opposite the front side and four side edges. The method also includes providing a seed metal layer on a silicon substrate of the solar cell, plating a first metal layer on the solar cell including plating a first metal layer along one side edge of the solar cell with a thickness of less than 1 micrometer, where plating the first metal layer is accomplished by conducting a first current through the seed metal layer using a metal in a bath, the conducting of the first current is performed in a first direction, at first voltage, and at a first time. The method includes ejecting metal from the first metal layer including the side edges of the solar cell by conducting a second current through the solar cell in a second direction, at a second voltage, and at a second time. Subsequent to ejecting metal from the first metal layer, the method may further include plating additional metal on the first metal layer by conducting a third current, at a third voltage, for a third time in the first direction.

Another method of plating a metal layer on a solar cell is disclosed. The method includes providing a solar cell having a front side configured to face the sun during normal operation, a back side opposite the front side and four side edges. The method also includes providing a solar cell with a seed metal layer on a silicon substrate and preparing an electroplating bath, where the electroplating bath is composed of an electrolyte solution, a first metal interconnect and a second metal interconnect submersed within the electroplating bath. The method includes connecting the first metal interconnect and the second metal interconnect and allowing the first and second metal interconnect to be coupled to a rectifier. The method also includes connecting a first metal to the first metal interconnect, connecting the solar cell to the second metal interconnect, plating a first metal layer on the solar cell, where plating the first metal layer is accomplished by conducting a first current through the seed metal layer using the first metal in the electroplating bath, the conducting of the first current performed in a first direction, at first voltage, and for a first time. The method also includes ejecting metal from the first metal layer by conducting a second current through the solar cell in a second direction, at a second voltage, and at a second time. Subsequent to ejecting metal from the first metal layer, the method can include plating additional metal on the first metal layer by conducting a third current, at a third voltage, for a third time in the first direction and disconnecting the first metal from the first metal interconnect where a second metal can be subsequently connected to the first metal interconnect. The method also includes plating a second metal layer on the solar cell by conducting a first current through the first metal layer, the conducting of the first current performed in a first direction, at first voltage, and for a first time. The method includes ejecting metal from the second metal layer by conducting a second current through the solar cell in a second direction, at a second voltage, and at a second time. Subsequent to ejecting metal from the second metal layer, plating additional metal on the second metal layer by conducting a third current, at a third voltage, for a third time in the first direction. Similar to that described above, the resulting solar cell includes a metal plated on the solar cell with interdigitated metal contact fingers running on the back side, but not along the side edges, of the solar cell. In another embodiment, plating metal on the solar cell includes plating interdigitated metal contact fingers running on the front side, but not along the side edges, of the solar cell. Also in yet another embodiment, plating the first and second metal layer unto the solar cell may include plating a first and second metal such as, but not limited to, copper, tin, aluminum, silver, gold, chromium, iron, nickel, zinc, ruthenium, palladium, or platinum.

Yet another method of plating a metal layer on a solar cell is disclosed. The method includes providing a solar cell having a front side configured to face the sun during normal operation, a back side opposite the front side and four side edges. The method also includes depositing a seed metal layer on a silicon substrate of the solar cell and plating a first metal layer on the solar cell by conducting an electric current through a seed metal layer of the solar cell. The method further includes subsequently performing an ultrasonic cleaning process to remove excess plated metals from the at least one side edge resulting from plating a first metal layer on the solar cell. In another embodiment, depositing a seed metal layer may include instead depositing a metal such as, but not limited to, copper, tin, tungsten, titanium, titanium tungsten, silver, gold, titanium nitride, tantalum nitride, ruthenium, or platinum.

Still another method of plating a metal layer on a solar cell is disclosed. The method includes providing a solar cell having a front side configured to face the sun during normal operation, a back side opposite the front side and four side edges. The method also includes depositing a seed metal layer using a physical vapor deposition (PVD) process on a silicon substrate of the solar cell and performing an ultrasonic cleaning process to remove excess metals from the at least one side edge of the solar cell. The method further includes subsequently plating a first metal layer on the solar cell by conducting an electric current through a seed metal layer of the solar cell, plating a second metal layer on the solar cell by conducting an electric current through the first metal layer and performing an ultrasonic cleaning process to remove excess plated metals from at least one side edge resulting from plating a first metal layer on the solar cell. In another embodiment, depositing a seed metal layer may include depositing a seed metal layer using a pattern-print deposition process on the silicon substrate of the solar cell.

Another method of plating a metal layer on a solar cell is disclosed. The method includes providing a solar cell having a front side configured to face the sun during normal operation, a back side opposite the front side and four side edges. The method also includes providing an ultrasonic setup which includes an ultrasonic medium, an enclosure to contain the ultrasonic medium and an ultrasonic generator. The method includes depositing a seed layer on a silicon substrate of the solar cell and plating a first metal layer on the solar cell by conducting an electric current through a seed metal layer of the solar cell. The method further includes subsequently performing an ultrasonic cleaning process which includes submersing the solar cell within the ultrasonic medium and vibrating the ultrasonic medium using the ultrasonic generator to remove excess plated metals adhering on the at least one side edge of the solar cell.

Yet another method of plating a metal layer on a solar cell is disclosed. The method includes providing a solar cell having a front side configured to face the sun during normal operation, a back side opposite the front side and four side edges. The method also includes providing an ultrasonic setup which includes an ultrasonic medium, an enclosure to contain the ultrasonic medium and an ultrasonic generator. The method includes depositing a seed layer on a silicon substrate of the solar cell and plating a first metal layer on the solar cell by conducting an electric current through a seed metal layer of the solar cell. The method further includes subsequently performing an ultrasonic cleaning process which includes submersing the solar cell within the ultrasonic medium and vibrating the ultrasonic medium within a frequency range of 20 to 400 kilohertz using the ultrasonic generator to remove excess plated metals adhering on the at least one side edge of the solar cell.

Still another method of plating a metal layer on a solar cell is disclosed. The method includes providing a solar cell having a front side configured to face the sun during normal operation, a back side opposite the front side and four side edges. The method also includes depositing a seed metal layer on a silicon substrate of the solar cell, plating a first metal layer on a solar cell, where plating the first metal layer is accomplished by conducting a first current through a the seed metal layer of the solar cell using a metal in a bath, the conducting of the first current performed in a first direction, at first voltage, and for a first time. The method also includes ejecting metal from the first metal layer by conducting a second current through the solar cell in a second direction, at a second voltage, and at a second time. Subsequent to ejecting metal from the first metal layer, plating additional metal on the first metal layer by conducting a third current, at a third voltage, for a third time, in the first direction and performing an ultrasonic cleaning process to remove excess plated metals from the at least one side edge resulting from plating a first metal layer on the solar cell.

Another method of plating a metal layer on a solar cell is disclosed. The method includes providing a solar cell having a front side configured to face the sun during normal operation, a back side opposite the front side and four side edges. The method also includes depositing a seed metal layer on a silicon substrate of the solar cell, preparing an electroplating bath including an electrolyte solution, a first metal interconnect and a second metal interconnect submersed within the electroplating bath coupled to a rectifier. The method includes connecting a first metal to the first metal interconnect, connecting the solar cell to the second metal interconnect and plating a first metal layer on a solar cell, where plating the first metal layer is accomplished by conducting a first current through the seed metal layer of the solar cell, the conducting of the first current performed in a first direction, at first voltage, and for a first time. The method also includes ejecting metal from the first metal layer by conducting a second current through the solar cell in a second direction, at a second voltage, and at a second time. Subsequent to ejecting metal from the first metal layer, plating additional metal on the first metal layer by conducting a third current, at a third voltage, for a third time, in the first direction. The method includes disconnecting the first metal from the first metal interconnect and subsequently connecting a second metal to the first metal interconnect. The method also includes plating a second metal layer on the solar cell, where the solar cell comprises a first metal layer over the seed layer on the silicon substrate and plating a second metal layer by conducting a first current through the first metal layer of the solar cell, where the first current is conducted in a first direction, at first voltage, and for a first time. The method includes ejecting metal from the second metal layer by conducting a second current through the solar cell in a second direction, at a second voltage, and at a second time. Subsequent to ejecting metal from the second metal layer, plating additional metal on the second metal layer by conducting a third current, at a third voltage, for a third time, in the first direction and performing an ultrasonic cleaning process to remove excess plated metals from the at least one side edge resulting from plating a first and second metal layer on the solar cell.

Figure 2:
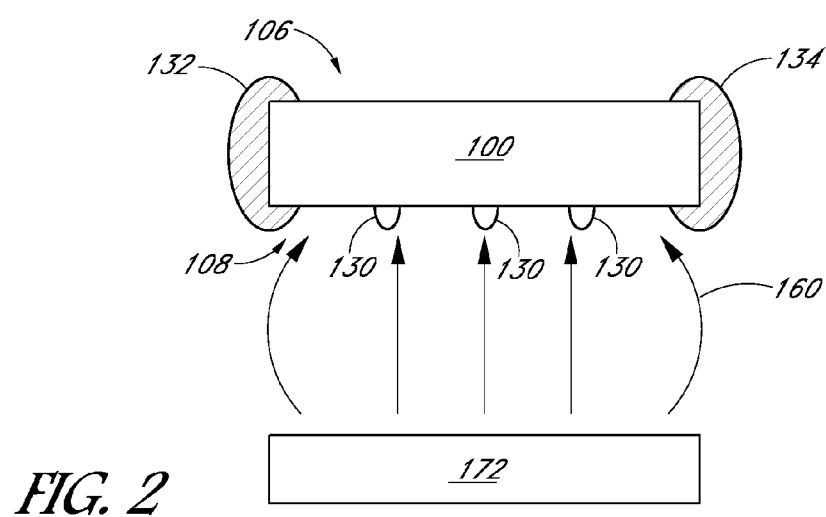

FIGS. 1 and 2 illustrate operations in a standard process for plating metal on a solar cell 100 including use of a first metal 172 and an electric field 160. The solar cell 100 can have a front side configured to face the sun during normal operation and back side opposite the front side. In a standard process, the device side or in this case the back side 108 including exposed regions along the solar cell edges can be plated with a metal 130, 132, 134. It can generally be undesirable to plate metal along the edges as it creates a metal ring along the edges. Such a metal ring may be unsatisfactory in the sale of the final product of a solar module, which is composed of a plurality of solar cells, as it is generally considered a cosmetic defect. During the fabrication process, the excess metal along the edge can also introduce a contamination risk, such as instances where grippers are used within tools sets. If a gripper is reused after transferring a solar cell, or in general a silicon wafer, with a metal ring, the gripper can cross contaminate other products in upstream processes sensitive to metal contamination, decreasing overall electrical yield output. As an example, provided the metal plated on the wafer is copper, the copper can interact with an encapsulant used in the manufacture of the solar module, becoming brown and discoloring over time. Such browning or discoloration may be undesirable as it can affect the over visual quality and appearance of the final solar module. The metal ring can also be a source for shorts in a solar module because the copper may peel off the edge and travel to another solar cell or within the same solar cell of the solar module. If the peeled-off portion falls between positive and negative regions on the device it can provide a junction for current to pass. Such a junction can create an electrical short between the positive and negative regions. The electrical short may be harmful to the solar module, decreasing its overall efficiency or causing it to malfunction altogether.

In general, during copper plating, it may be desirable to only plate copper on the face of the solar cell, which may either be the front side 106 or the back side 108 of the solar cell. In usual practice, however, stray plating occurs on the solar cell. The main source for this edge plating comes from the common condition that the electrical field in solution is almost always at the solar cell edge. This may be due to damage sites at the solar cell edge allowing current to pass on the edge of the solar cell. To avoid leaving copper or other such metal along the solar cell edge, either the edge of the solar cell must be electrically isolated from the solution during plating, or the plated copper on the edge may need to be removed. Several standard solutions to mitigating the effects of plating metal along the edges of a solar cell are described below in association with FIGS. 3-5.

Figure 3:
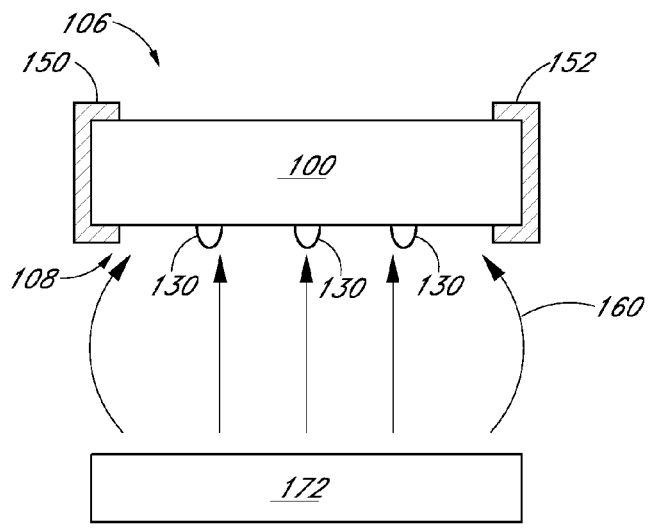
Figure 4:
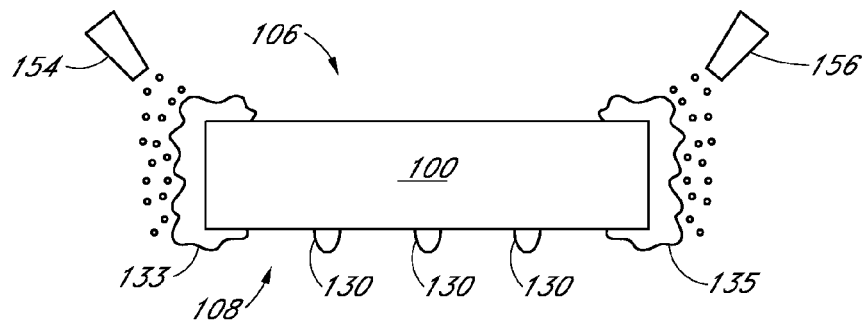
Figure 5:
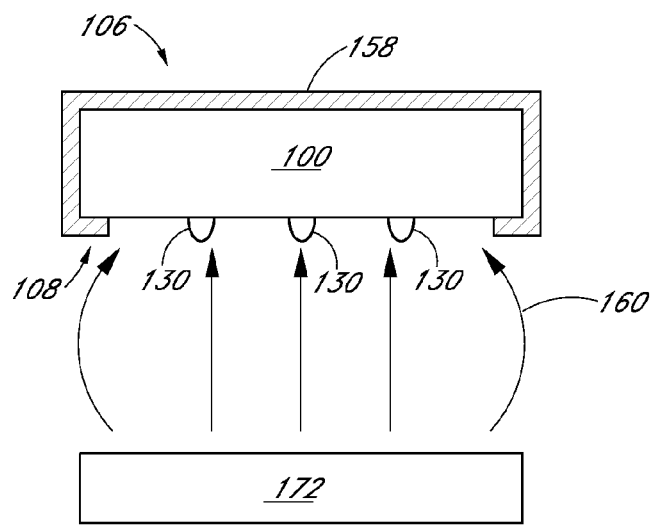

With reference to FIGS. 3, 4, and 5, there are shown standard methods of plating metal to a solar cell 100. A first method to prevent the build-up of metal along the solar cell 100 edges during electroplating includes applying a resist along the edges. FIG. 3 depicts electroplating a solar cell with an edge resist, where a first metal 172 is used to plate a metal forming a first metal layer 130 using an electric field 160 on the back side 108 of the solar cell 100. A resist 150, 152 is applied along the edges of the solar cell 100 to prevent metal from plating as in FIG. 2. The application of the resist, though, may be costly as it may add additional operations to the solar cell fabrication process. Another common practice is to remove the plated metal along the edges post plating. A chemical etch process can be used to remove the plated metal as seen in FIG. 4. Such methods include spraying 154, 156 an etchant along the sides of the solar cell 100, etching away the plated regions 133, 135 but leaving the plated region 130 intact during fabrication. The etchant can typically be a mix of hydrogen peroxide and sulfuric acid. A drawback to this method may be the presence of fluid wrap-around to the plated side of the solar cell 100. This method also requires defining of exclusion zones several millimeters in from the solar cell 100 edge. These exclusion zones, unless optimized, may allow for splashing of excess etchant on the solar cell which may in turn cause further damage to the solar cell 100. While the optimization of such exclusion zones may be beneficial to other semiconductor industries the need for these exclusion zones on a solar cell may be unacceptable. For example, the exclusion zone may minimize the electricity generating region and the overall efficiency of the solar cell 100.

Yet another common industrial technique is to block plating at the edge using gasketing as seen in FIG. 5. In this method the solar cell 100 can be fitted with a liquid tight seal or gasket 158 close to the solar cell edge, shutting down the possibility of plating at the edge. Again, such an approach may create an exclusion zone on the plated side of the solar cell where the gasket 158 sits. Furthermore, standard wafers are typically much thicker than wafers used for solar applications. It may become increasingly difficult to provide sufficient pressure to a wafer to create a liquid tight seal as the wafer thickness gets smaller and smaller. The above described methods can be inefficient, not cost effective or not applicable to the solar cell fabrication process. In the proceeding descriptions, details of embodiments of the present inventions are described that may provide an alternative solution to the process of preventing plated metal build-up along the edge of a solar cell during a fabrication process.

The various tasks performed in connection with manufacturing processes are shown in FIGS. 6-38. Also, several of the various tasks need not be performed in the illustrated order, and it can be incorporated into a more comprehensive procedure, process or fabrication having additional functionality not described in detail herein.

Figure 6:
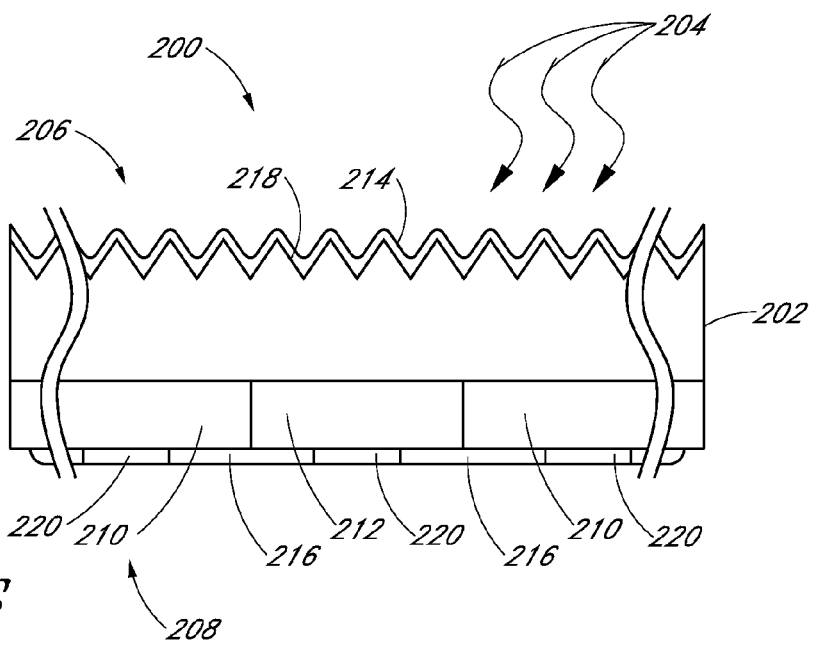
FIGS. 6-14 are cross-sectional representations of a solar cell being fabricated in accordance with an embodiment of the present inventions.
Figure 7:
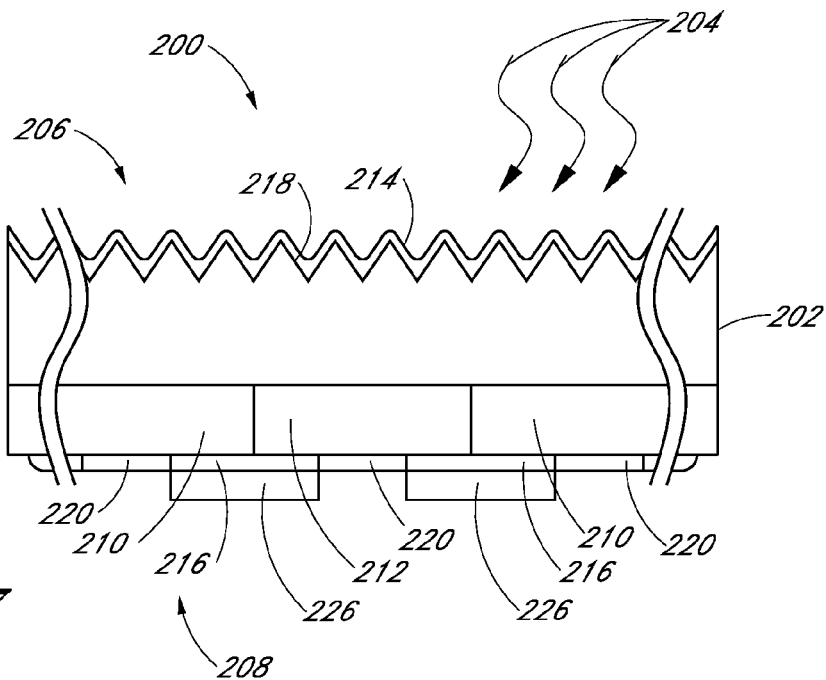

FIGS. 6 and 7 illustrate an embodiment for plating metal to a solar cell 200 including a silicon substrate 202 and a first and second doped regions 210, 212. The solar cell can have a front side 206 that faces the sun to receive light 204 during normal operation and a back side 208 opposite the front side 206. In some embodiments, the silicon substrate 202 of the solar cell 200 can be cleaned, polished, planarized, and/or thinned or otherwise processed prior to the formation of the first and second doped regions 210, 212. In yet another embodiment the silicon substrate 202 is composed of polysilicon or multicrystalline silicon. In another embodiment, a first and second doped regions 210, 212 are grown by a thermal process. In yet another embodiment, the doped regions 210, 212 are formed by depositing dopants in the silicon substrate by a conventional doping process referring to FIG. 6. In still another embodiment, an oxide layer is deposited over the first doped region 210 and over the second doped region 212, serving as a protective barrier for both regions. The first and second doped regions 210, 212 can each include a doping material but is not limited to a positive-type dopant such as boron or a negative-type dopant such as phosphorous. Although both the first and second doped regions 210, 212 are described as being grown by a thermal process or formed by depositing dopants in the silicon substrate by a conventional doping process referring to FIG. 6, respectively, as with any other formation, deposition, or growth process operation described or recited here, each layer or substance can be formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique can be used where formation is described. Thus, and similarly, the first and second doped region 210, 212 can be formed on the silicon substrate 202 by a deposition technique, sputter, or print process, such as inkjet printing or screen printing. The solar cell 200 can be provided with a texturized silicon region or a texturized surface 218 on the front side 206 of the solar cell for increased solar radiation collection. A texturized surface 218 can be one which has a regular or an irregular shaped surface for scattering incoming light, decreasing the amount of light reflected back off the surface of the solar cell. An anti-reflective coating (ARC) 214 can be formed over the texturized surface 218 over front side 206 to further improve the light absorption properties of the solar cell. An anti-reflective coating (BARC) 216 can also be formed on the back side 208 of the solar cell 200. Both the ARC 214 and BARC 216 layers can be composed of silicon nitride (SiN) or any other material that is commonly used for anti-reflective coating of a solar cell. A plurality of contact holes with an embedded seed metal layer 220 may be provided. The contact holes can be formed by any number of lithography processes including wet etching and ablation techniques. In another embodiment, a plating resist 226 is applied to the back side 208 of the solar cell 200. The plating resist 226 functions as a masking layer between the first and second doped regions 210, 212 during an electroplating process, effectively separating the plated metal between the first and second doped regions 210, 212. In general, the application of the plating resist 226 can be optional in the fabrication process.

Figure 8:
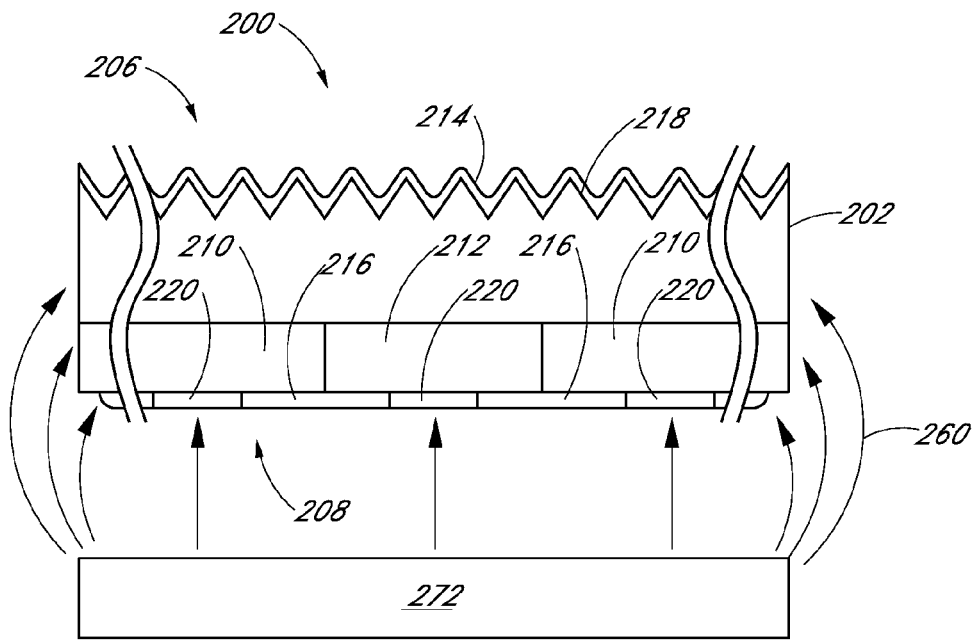
Figure 9:
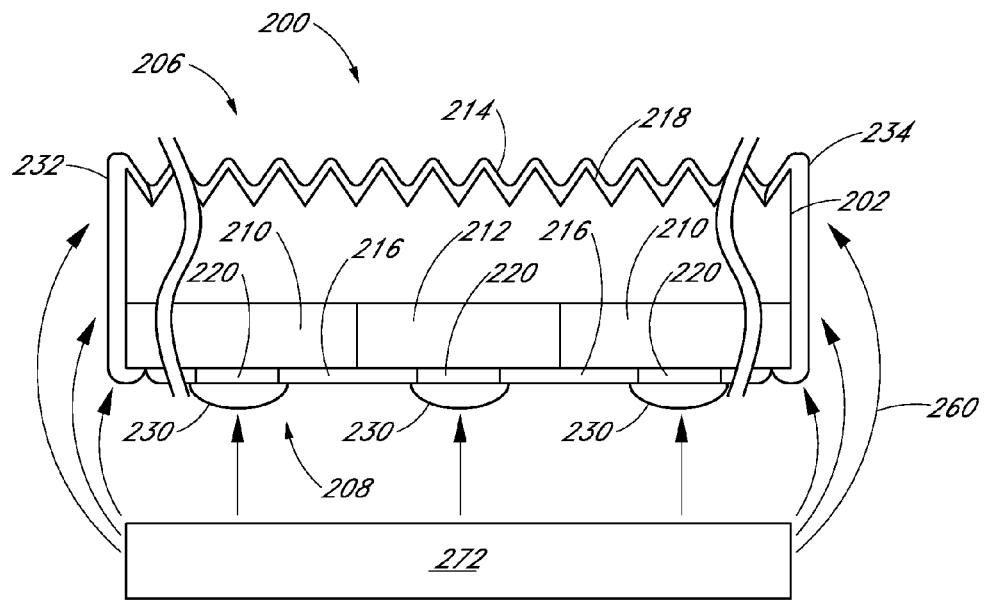
Figure 10:
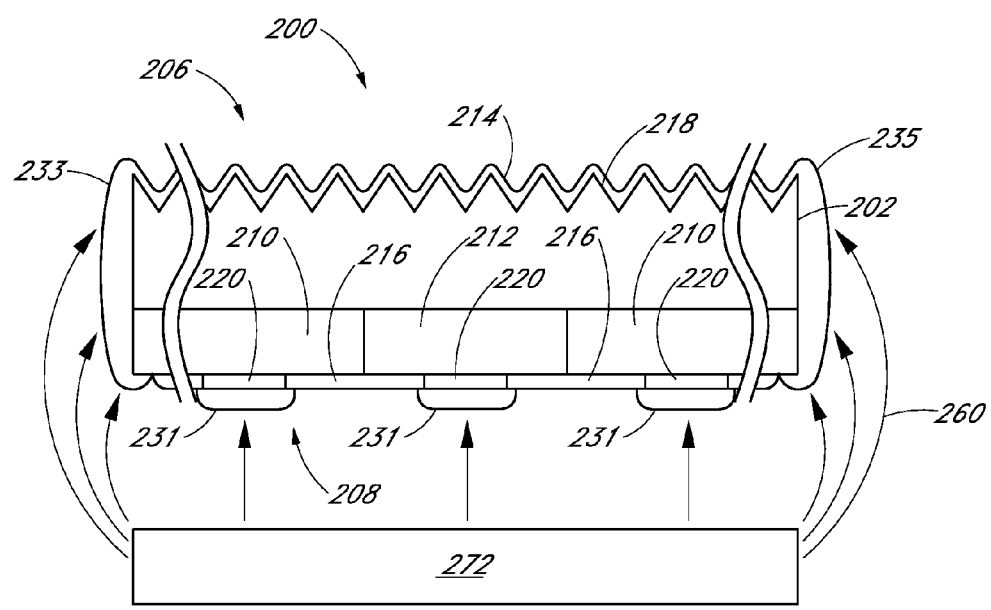
Figure 11:
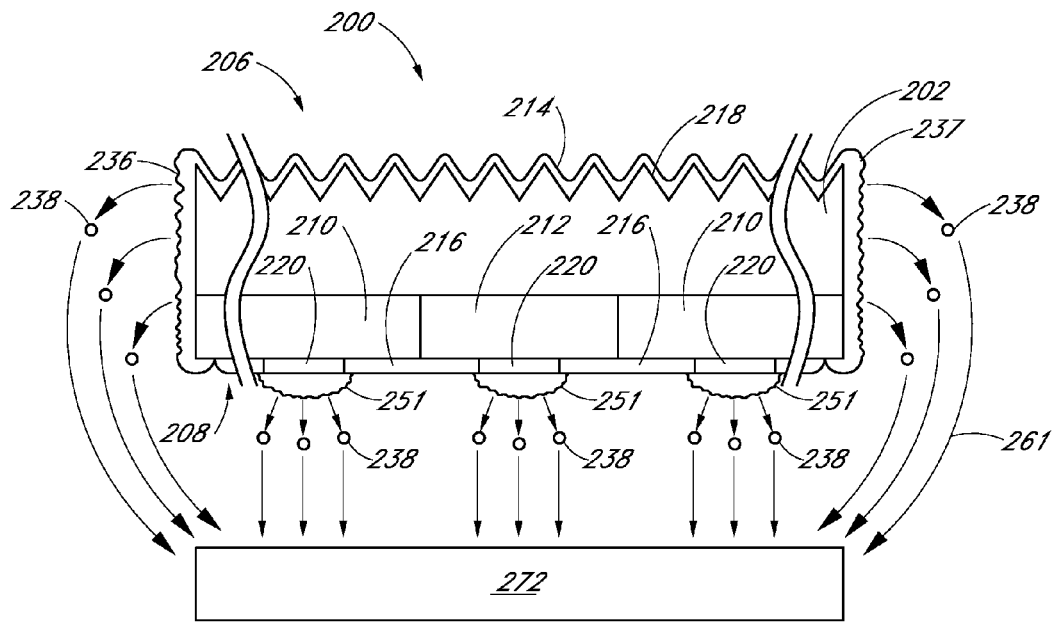

With reference to FIGS. 8, 9, and 10, there are shown a continuation of the method of plating metal to the solar cell 200. The method further includes a plating process that can be used to plate a first metal layer 230 over the seed metal layer 220 of the solar cell. The plating process can be accomplished by conducting a first current through the seed metal layer 220 using a first metal 272 in an electroplating bath. A by-product of the process can be the plating a first metal layer along the edges of the solar cell 232, 234. The first current 260 or electric field can be generated using at a first voltage defined over a particular time. The first current 260 can range from 0 to 5 amperes. In an embodiment, the first current 260 can range from 0 to 200 amperes. The first direction can be in the direction toward plating metal unto the solar cell 200. The first voltage can be in the range of 0 to 5 volts. In an embodiment, the first voltage can be in the range of 0 to 50 volts. The first time can be at duration of 0 to 1000 milliseconds. In an embodiment, the first time can be at duration of 0 to 5000 milliseconds. As described above, it is generally undesirable to plate metal along the edges 232, 234 of the solar cell 200 as it creates a metal ring along the edges, where this metal ring can be the source of various defects described above. Conducting the first current in a first direction, at the first voltage and at the first time can be performed at the start or at an intermediate state in the plating process. Continued conduction of the first current 260 can be used to plate additional metal forming a first thick metal layer 231 over the seed metal layer 220 and over the side edges 233, 235 of the solar cell 200.

Figure 12:
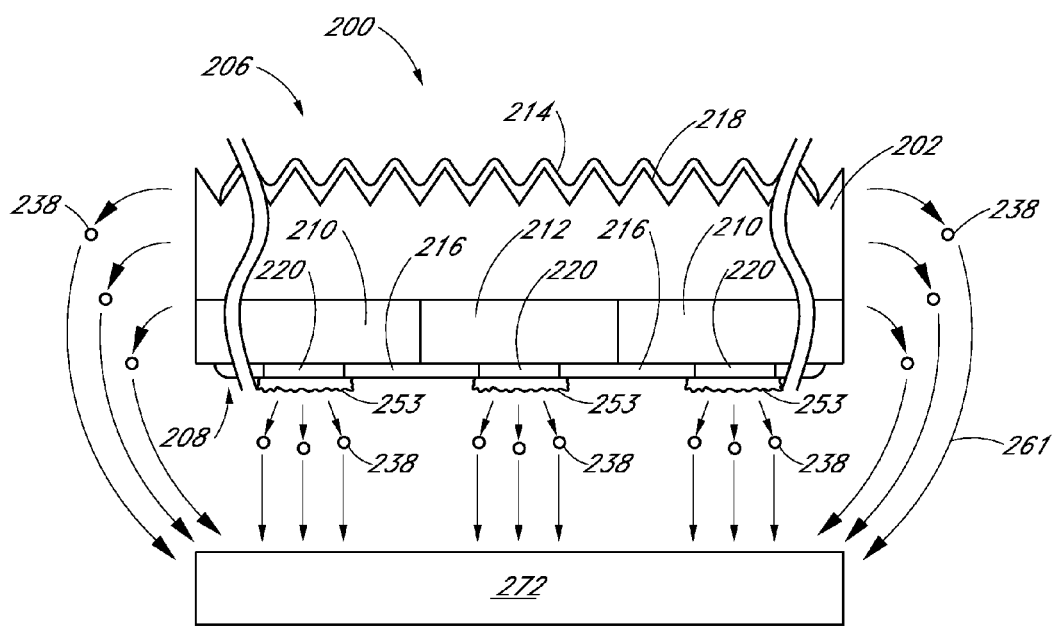
Figure 13:
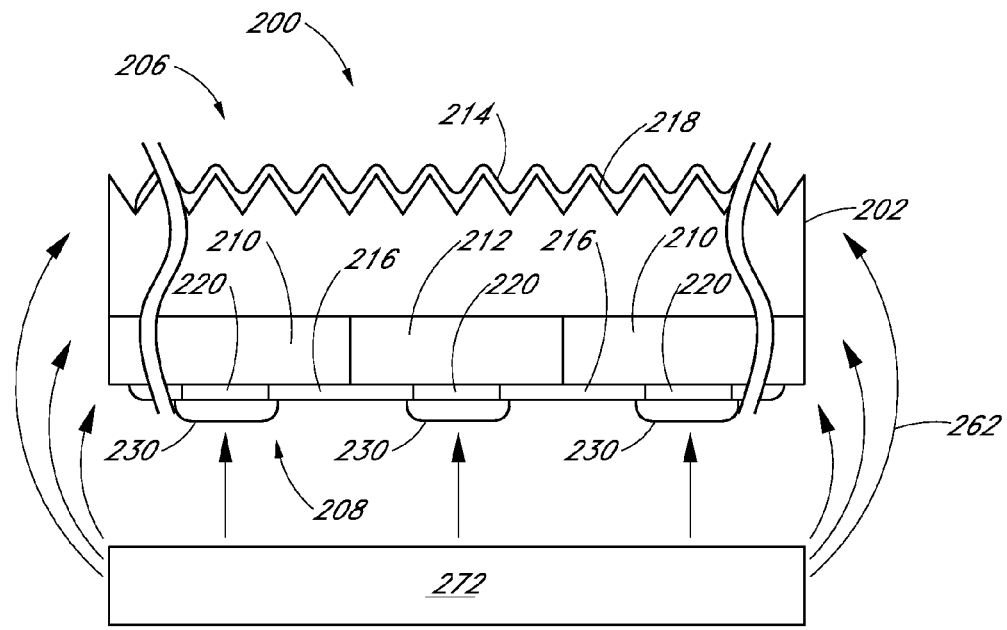
Figure 14:
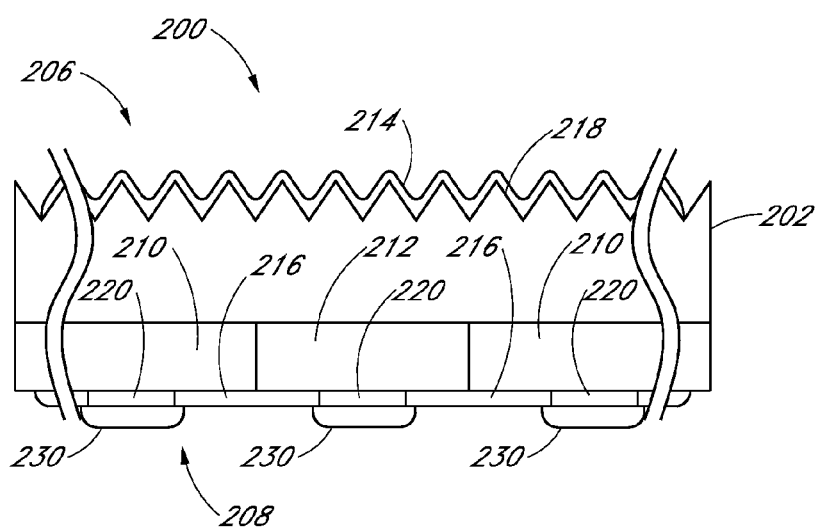

FIGS. 11, 12, 13 and 14 illustrate a continuation of the method of plating metal to the solar cell 200. The method further includes ejecting metal or excess metal 238 from a first thick metal layer undergoing a deplating process 251, 236, 237 by conducting a second current 261 through the solar cell 200. Similar to the above, the second current 261 can range from 0 to 5 amperes. In an embodiment, second current 261 can range from 0 to 200 amperes. The second direction can be in the direction away from solar cell 200. The second voltage can be in the range of 0 to 5 volts. In an embodiment, the second voltage can be in the range of 0 to 50 volts. The first time can be at duration of 0 to 1000 milliseconds. In an embodiment, the first time can be at duration of 0 to 5000 milliseconds. In another embodiment, the second voltage is equal to the first voltage. In yet another embodiment, the second current 261 is opposite the first current 260. In still another embodiment, the second current 261 is in reverse bias with respect to the first current 260. In another embodiment, the second voltage is the opposite of the first voltage. In still another embodiment, the second time is the same duration of the first time. FIG. 12 shows the continued conduction of the second current 261, where the continued conduction of the second current 261 can remove excess metal 238 and form a first thin metal layer 253 over the seed metal layer 220. The continued conduction of the second current 261 can remove excess metal 238 from the edges of the solar cell 200. Subsequent to ejecting metal 238, additional metal can be plated to the first thin metal layer 253 forming the first metal layer 230 by conducting a third current 262 at a third voltage for a third time in the first direction as seen in FIG. 13. The combined plating processes described between FIGS. 8 and 13 can be alternated to remove any excess metal 238 found along the edges forming the solar cell 200 depicted in FIG. 14.

With reference to FIGS. 15-19, there are shown a continuation of the method of plating metal to the solar cell 300. Unless otherwise specified below, the numeric indicators used to refer to the components in FIGS. 6-14 are similar to the components in FIGS. 15-38, except that the index has been incremented in increasing units of 100.

Figure 15:
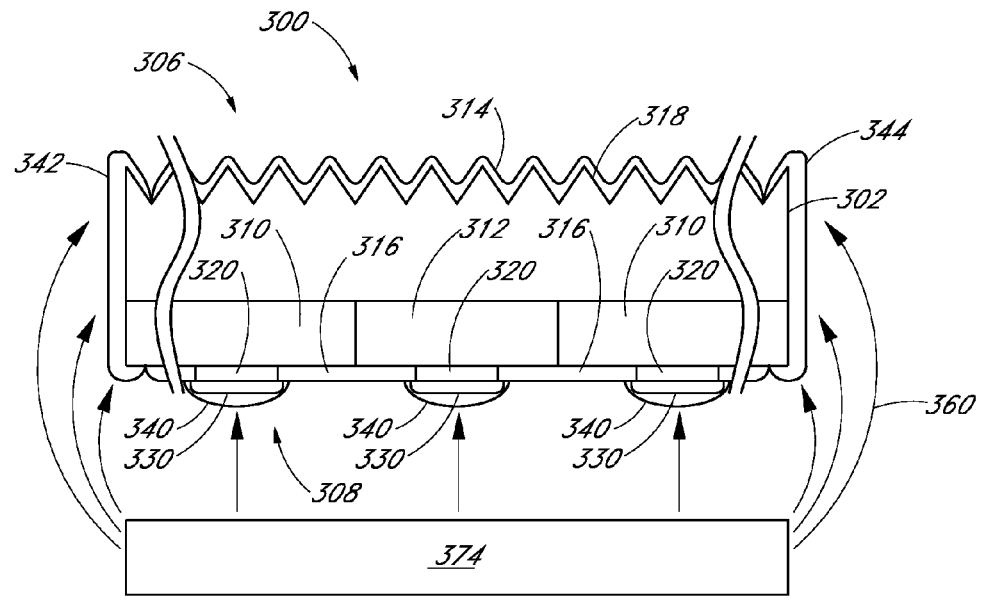
FIGS. 15-19 are cross-sectional representations of a solar cell being fabricated in accordance with another embodiment of the present inventions.
Figure 16:
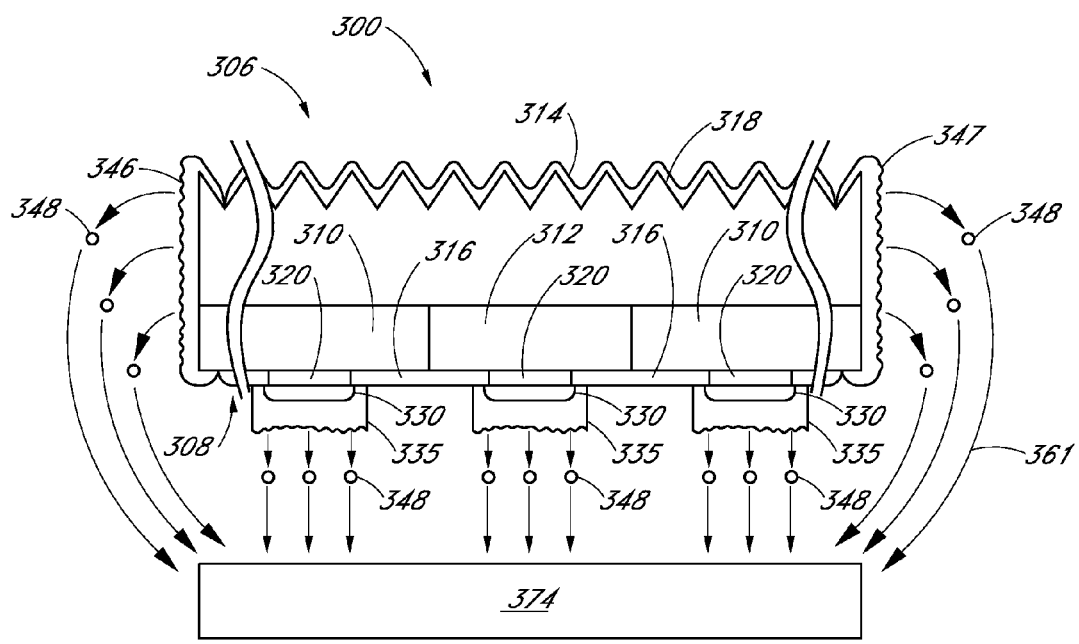

With reference to FIG. 15, a continuation of the method of plating metal to the solar cell 300 is shown. The method further includes a plating process that can be used to plate a second metal layer 340 over the first metal layer 330 of the solar cell. The plating process of plating a second metal layer 340 over the first metal layer 330 can be accomplished by conducting a first current 360 through the first metal layer 330 using a second metal 374 in an electroplating bath. A consequence of the process for plating a second metal layer 340 over the first metal layer 330 can be plating of a first metal layer along the edges of the solar cell 342, 344. Similar to the above, the first current 360 can be generated at a first voltage defined over a particular time. Similar to the above and shown in FIGS. 8, 9 and 10, the first current 360, first direction, first voltage and first time can be any of the above described values. As mentioned in the description above, it is generally undesirable to plate metal along the edges 342, 344 of the solar cell 300 as it creates a metal ring along the edges, where this metal ring may be the source of various defects. Conducting the first current 360 in a first direction, at the first voltage and at the first time can also be performed at the start or at an intermediate state in the plating process. Continued conduction of the first current 360 can plate additional metal forming a second thick metal layer over the first metal layer 330 and over the side edges of the solar cell 300 similar to the process that described and shown in the embodiment in FIG. 10.

Figure 17:
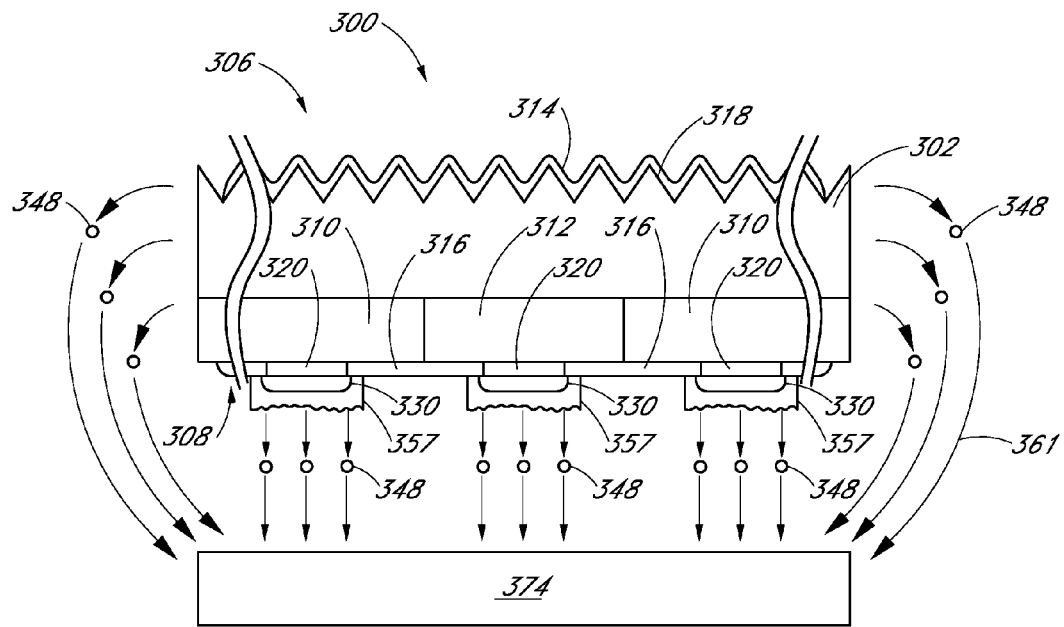
Figure 18:
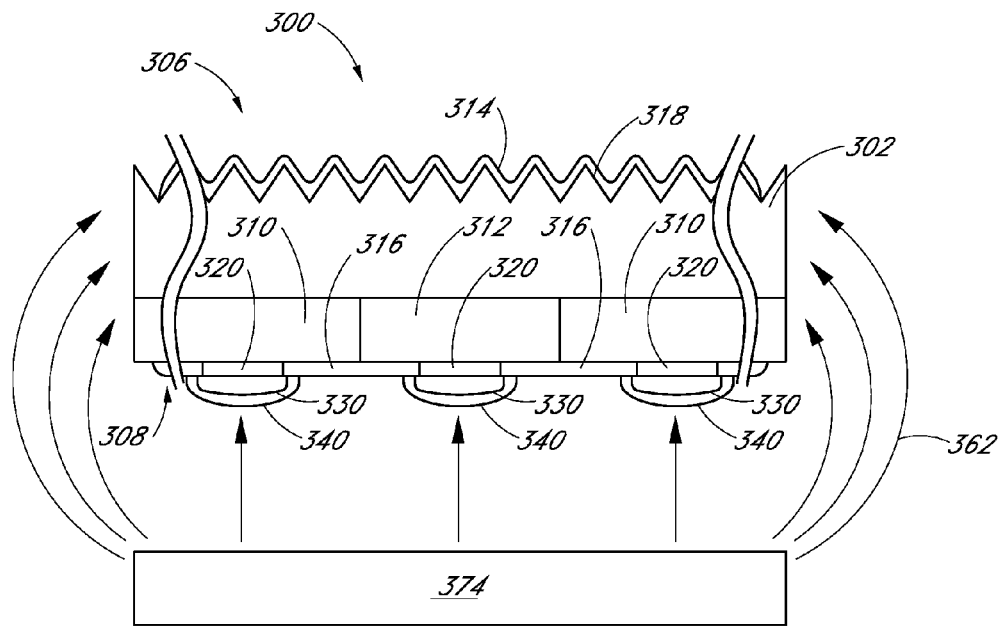
Figure 19:
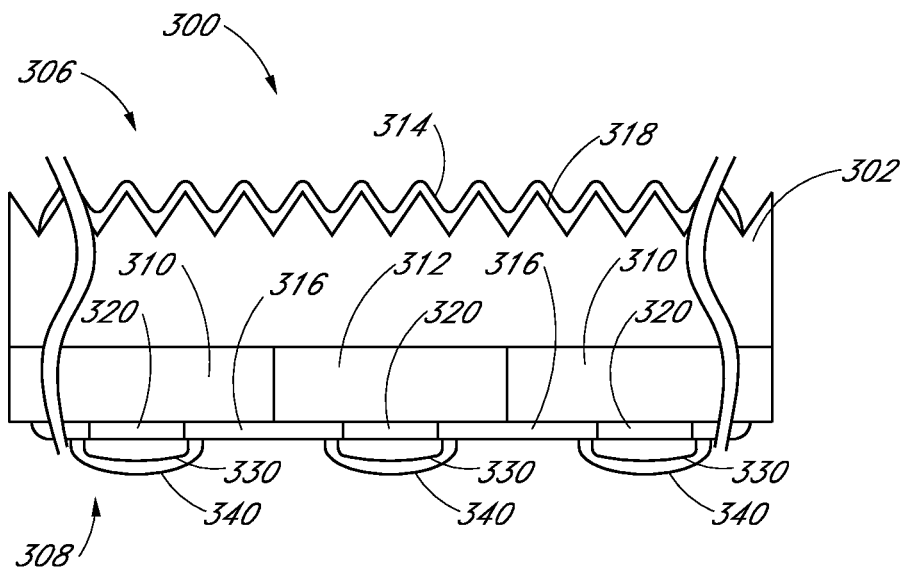

FIGS. 16-19 illustrate a continuation of the method of plating metal to the solar cell 300. The method further includes ejecting excess metal 348 from a second thick metal layer undergoing a deplating process 335, 346, 347 by conducting a second current 361 through the solar cell 300. Similar to the above and shown in FIGS. 11 and 12, the second current 361, second direction, second voltage and second time can be any of the above described values. FIG. 17 shows the continued conduction of the second current 361, where the continued conduction of the second current 361 can remove excess metal 348 along the edges of the solar cell 300. Continued conduction of the second current 361 can also form a second thin metal layer 357 over the first metal layer. Subsequent to ejecting metal 348, additional metal can be plated to the first thin metal layer 330 forming the second metal layer 340 referring to FIG. 18 by conducting a third current 362 at a third voltage for a third time in the first direction. The combined plating processes described between FIGS. 15 and 18 can be alternated to remove any excess metal 348 found along the edges forming the solar cell 300 depicted in FIG. 19.

Figure 20:
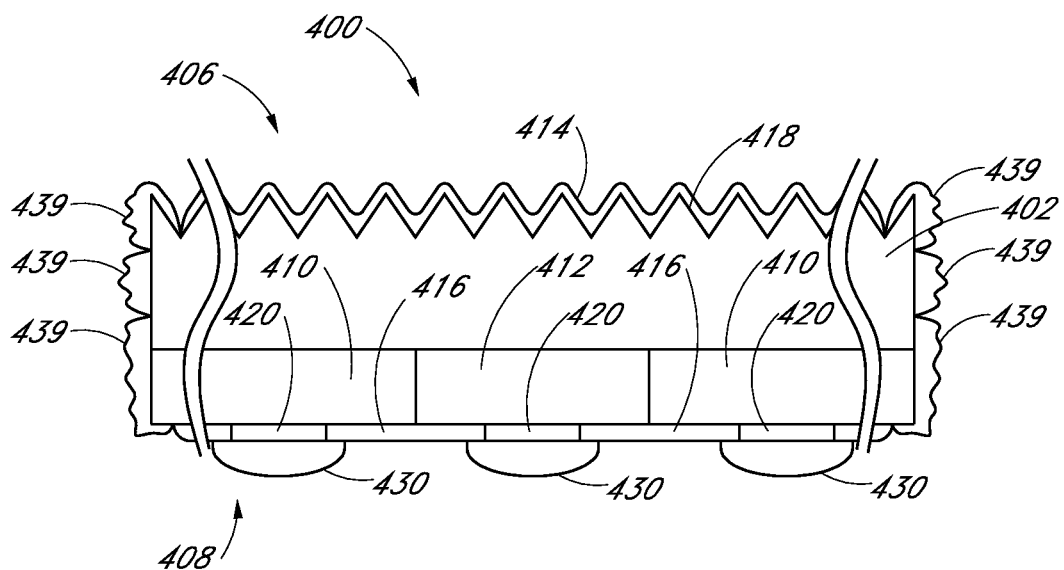
FIGS. 20-27 are cross-sectional representations of a solar cell being fabricated in accordance with still another embodiment of the present inventions.

With reference to FIG. 20, another embodiment of plating metal to the solar cell 400 is shown. The method can include using a solar cell having a silicon substrate 402 and a first and second doped regions 410, 412. The solar cell can have a front side 406 that faces the sun during normal operation and a back side 408 opposite the front side 406. The solar cell 400 can be provided with a texturized silicon region or a texturized surface 418 on the front side 406 of the solar cell for increased solar radiation collection. An ARC layer 414 can be formed over the texturized surface 418 and on front side 406 to further improve the light absorption properties of the solar cell 400. A BARC layer 416 can also be formed on the back side 408 of the solar cell 400. Both the ARC 414 and BARC 416 layers can include a material that is commonly used for anti-reflective coating of a solar cell such as silicon nitride (SiN). A plurality of contact holes with an embedded seed metal layer 420 may be provided. The contact holes can be formed by any number of techniques described above. A first metal layer 430 can be plated to the seed metal layer 420 using a standard electroplating process. Any electroplating process, such as the process described above, can be used. Defect sites along the edges of the solar cell can also be sources for edge plating excess metal. As a result, nodules of excess metal 439 can form at the edges of the solar cell. In an embodiment, nodules, such as nodules made up of copper, can be connected to the solar cell by thin thread of metal.

Figure 21:
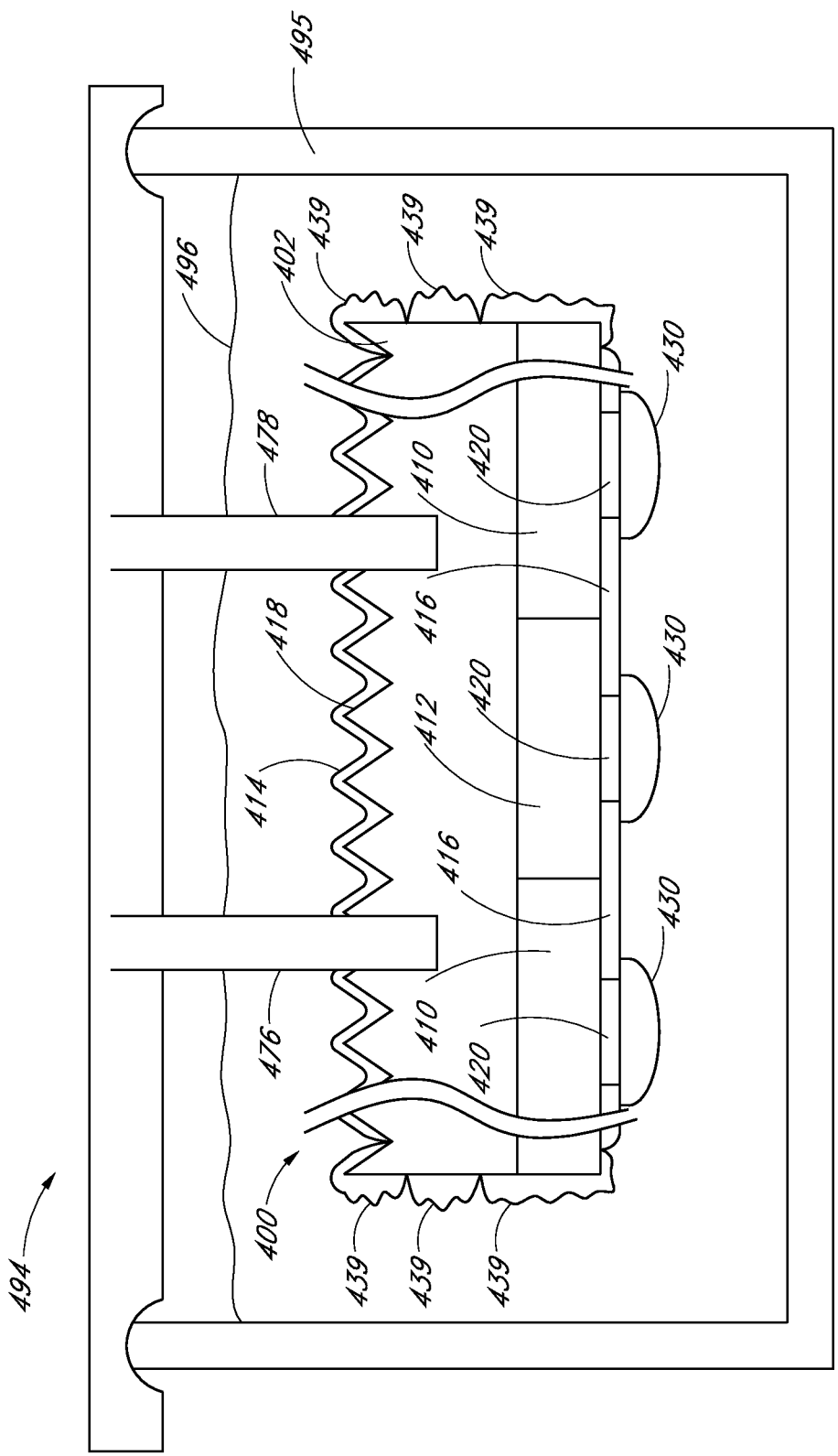
Figure 22:
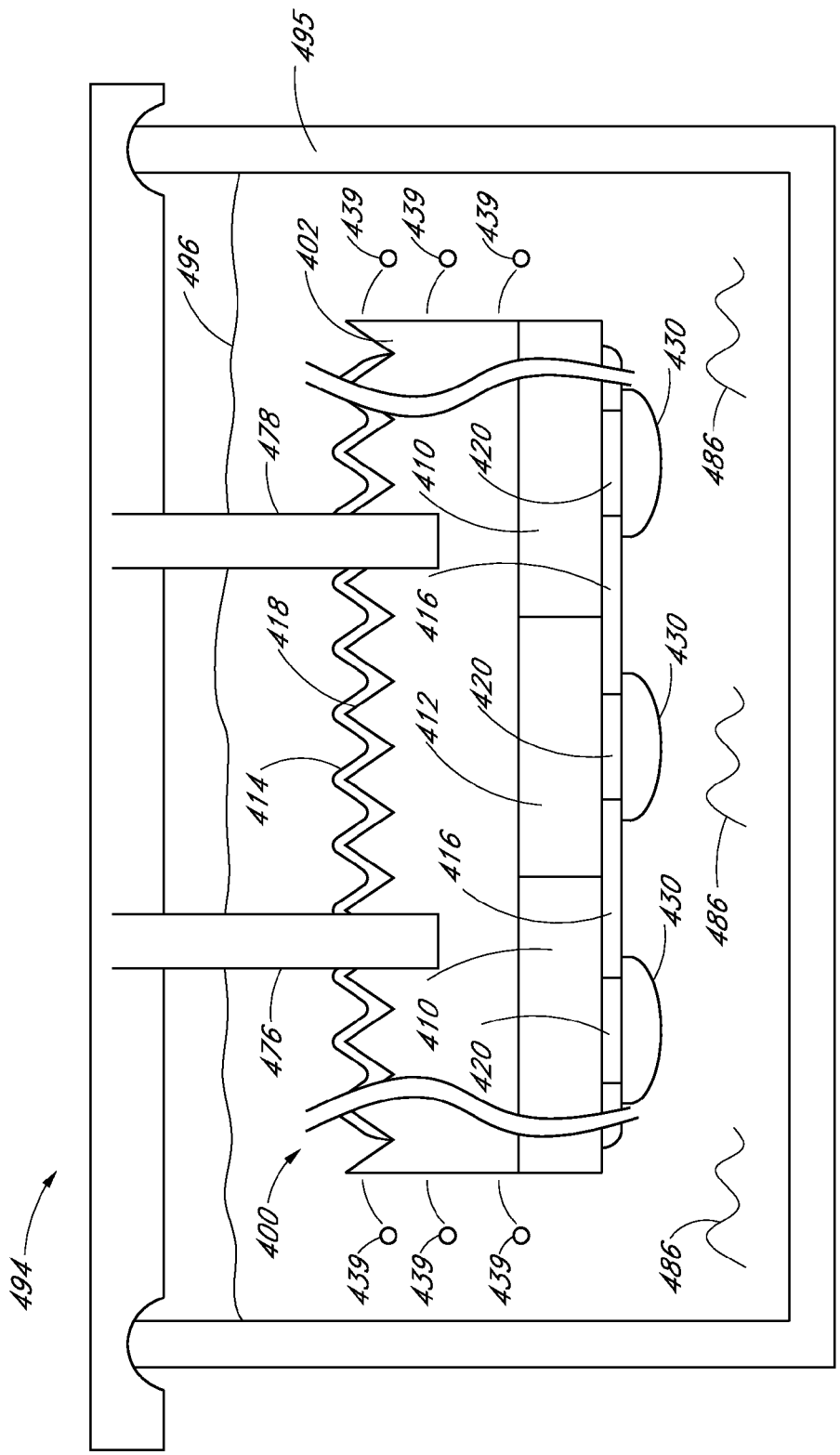
Figure 23:
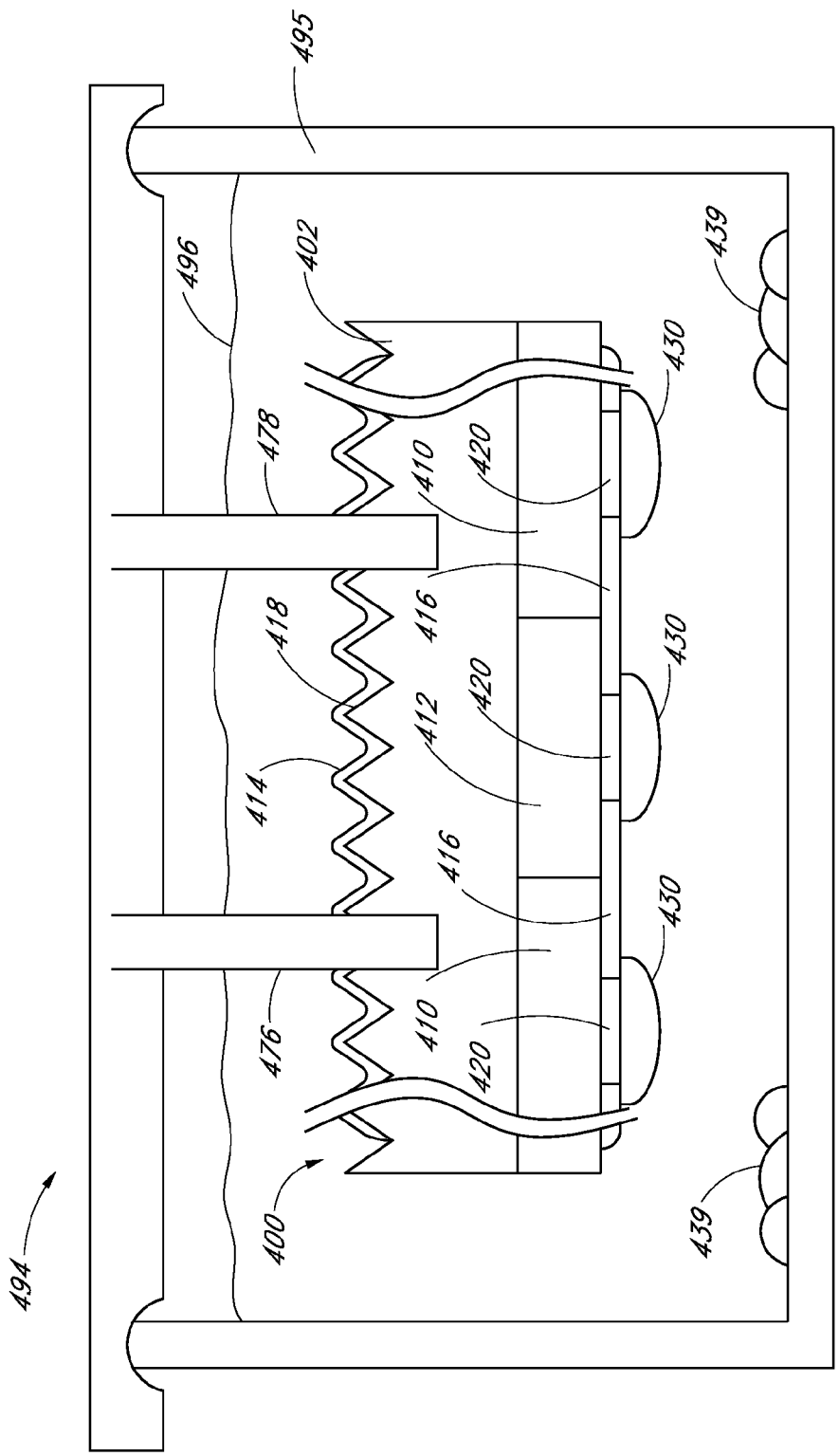
Figure 24:
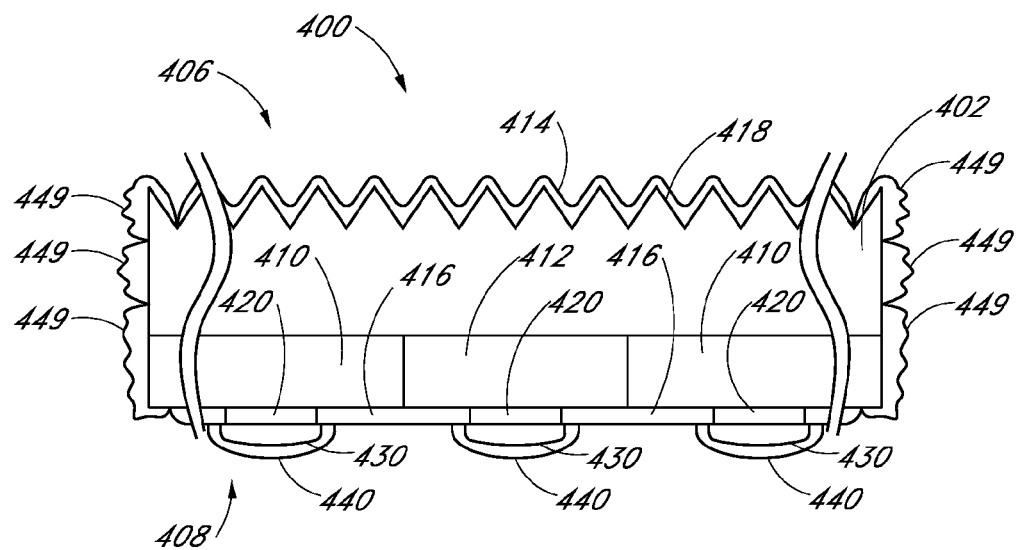
Figure 26:
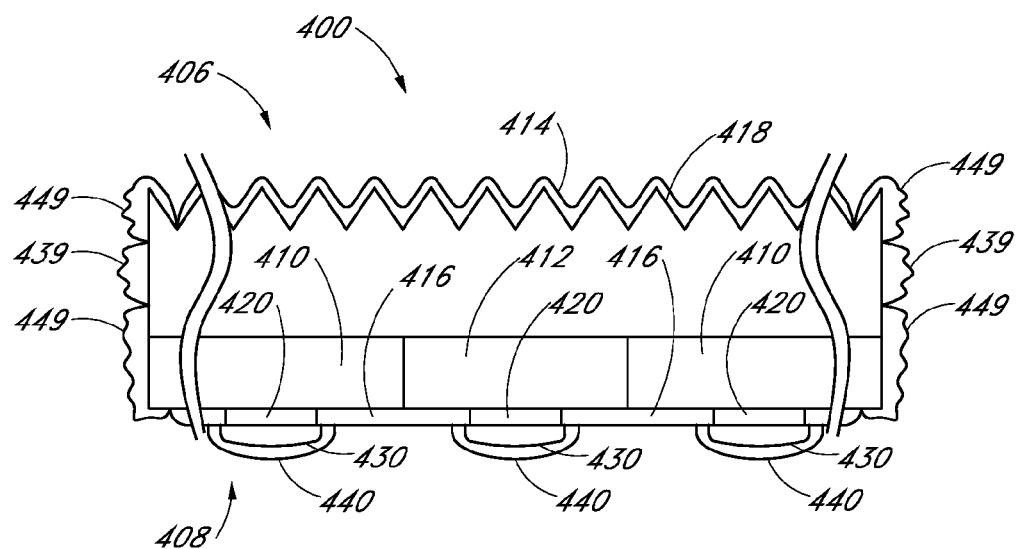
Figure 25:
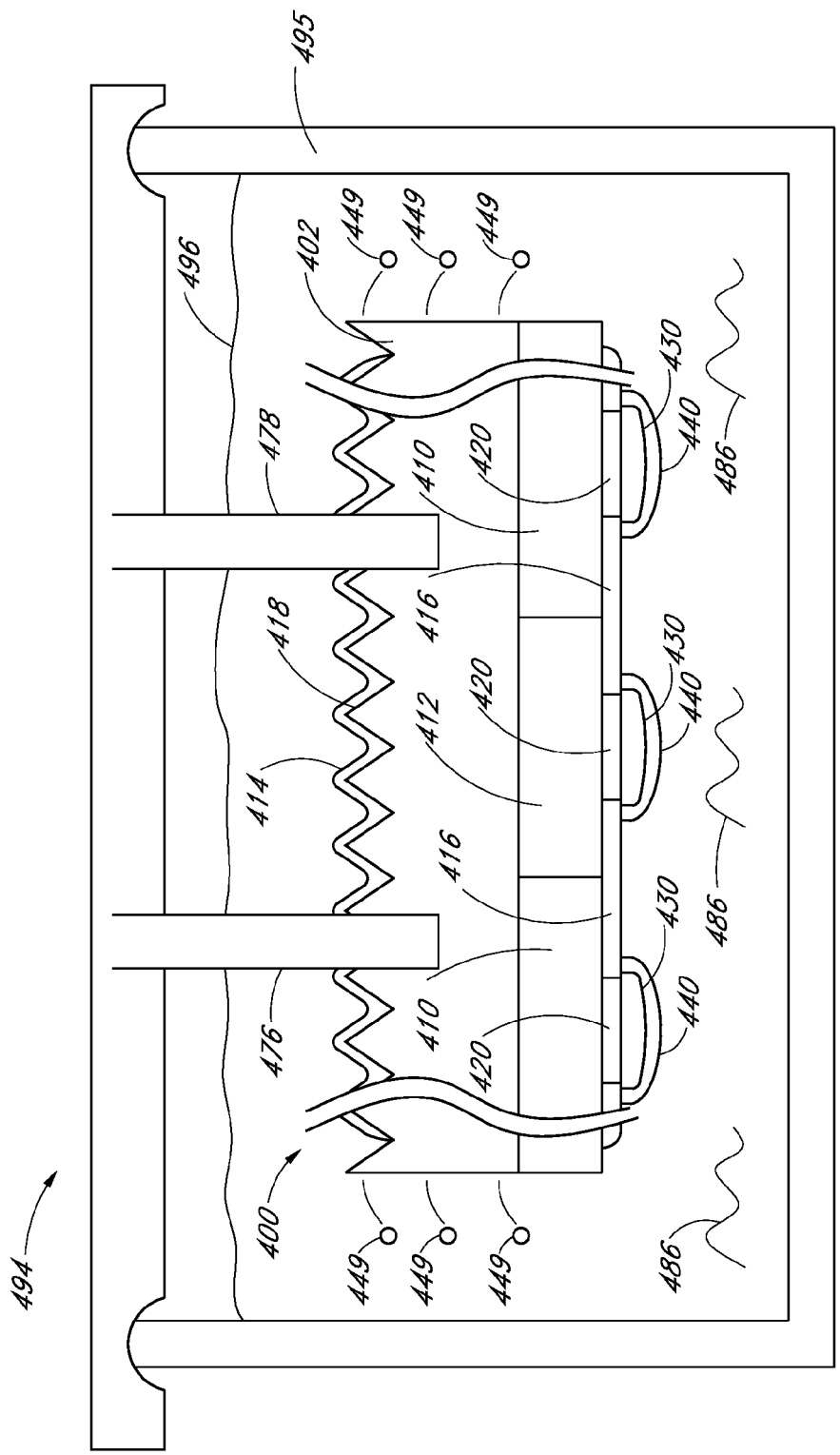
Figure 27:
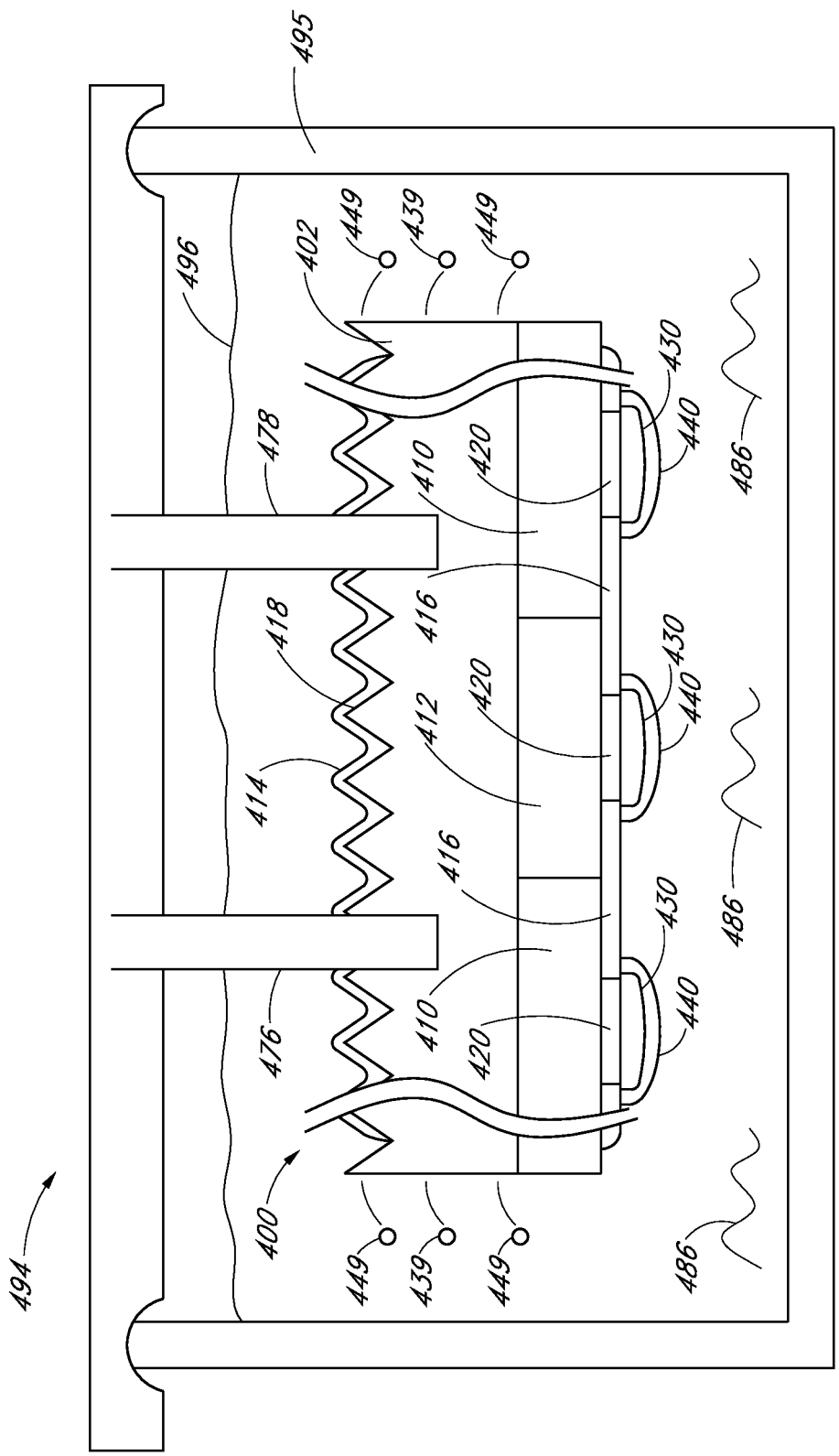

FIGS. 21-26 illustrate a continuation of the method of plating metal to the solar cell 400. The method further includes providing an ultrasonic setup 494 which includes an ultrasonic medium 496, an enclosure 495 to contain the ultrasonic medium 496 and an ultrasonic generator. The solar cell 400 can be suspended by clamps 476, 478. An ultrasonic cleaning process can be subsequently performed after a standard plating process or one of the plating processes described above. The ultrasonic cleaning process can involve submersing the solar cell within the ultrasonic medium 496 as seen in FIG. 21. The ultrasonic medium 496 can be vibrated 486 using the ultrasonic generator to remove excess plated metals 439 adhering to the at least one side edge of the solar cell as depicted in FIGS. 22 and 23. Similarly, the ultrasonic cleaning process can also be applied to the solar cell 400 in FIG. 24 which includes a second metal layer 440 over a first metal layer 430 and excess metal 449 plated along the solar cell 400 edges. FIG. 25 depicts an ultrasonic cleaning process where the ultrasonic medium 496 can be vibrated 486 to remove excess plated metals 449 adhering to the at least one side edge of the solar cell of FIG. 24. In the same manner, the ultrasonic cleaning process can also be applied to the solar cell 400 in FIG. 26 which includes a second metal layer 440 over a first metal layer 430 and excess metal 439, 449 plated along the solar cell 400 edges. In another embodiment, the excess metal 439, 449 is composed of the same material of the first and second metal layers 430, 440 respectively. FIG. 27 depicts an ultrasonic cleaning process where the ultrasonic medium 496 can be vibrated 486 to remove excess plated metals 449, 439 adhering to at least one side edge of the solar of FIG. 26. In an embodiment, the ultrasonic medium 496 includes, but is not limited to, water, air, surfactant solutions, ionic solutions, acids and bases.

Figure 28:
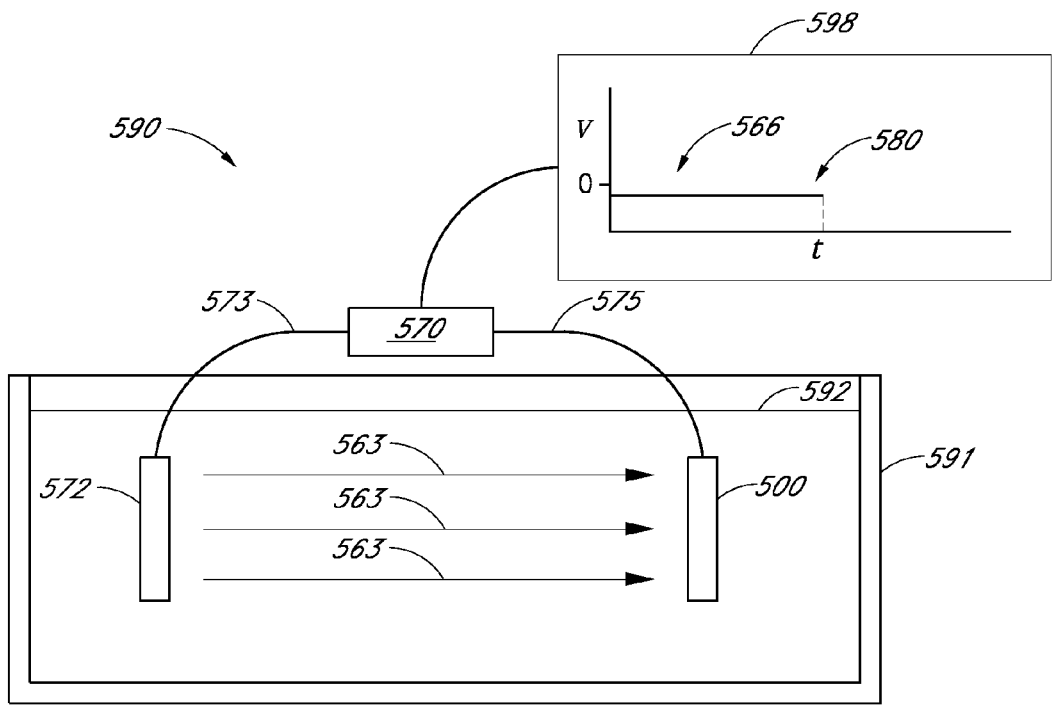
FIGS. 28-31 are cross-sectional representations of a solar cell being fabricated in accordance with yet another embodiment of the present inventions.
Figure 29:
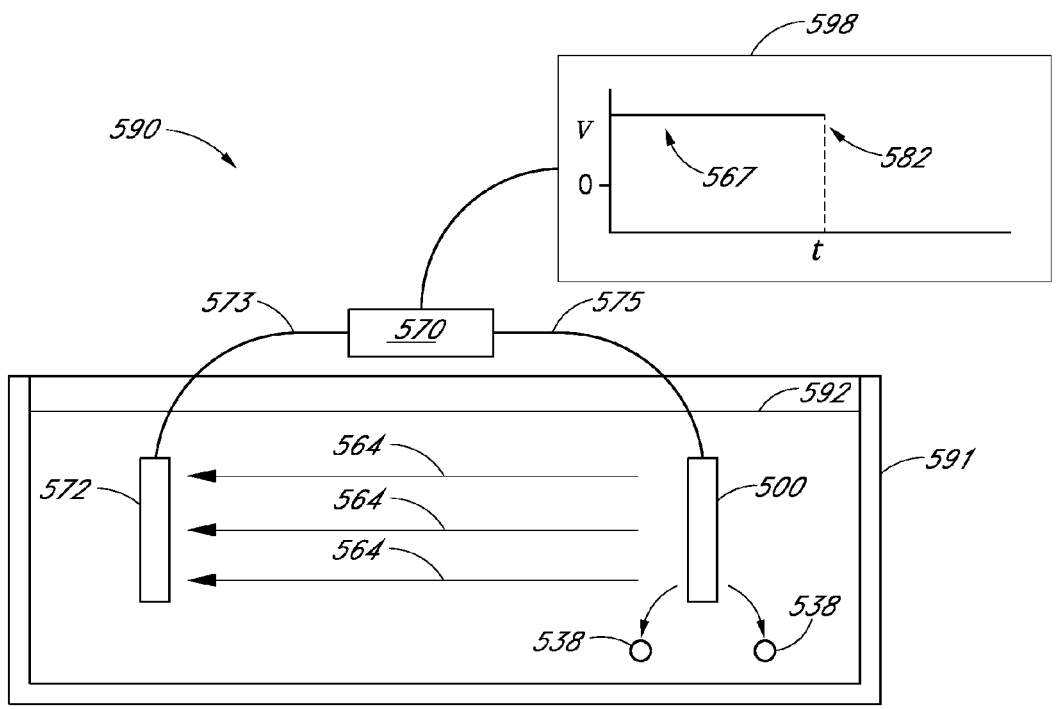
Figure 30:
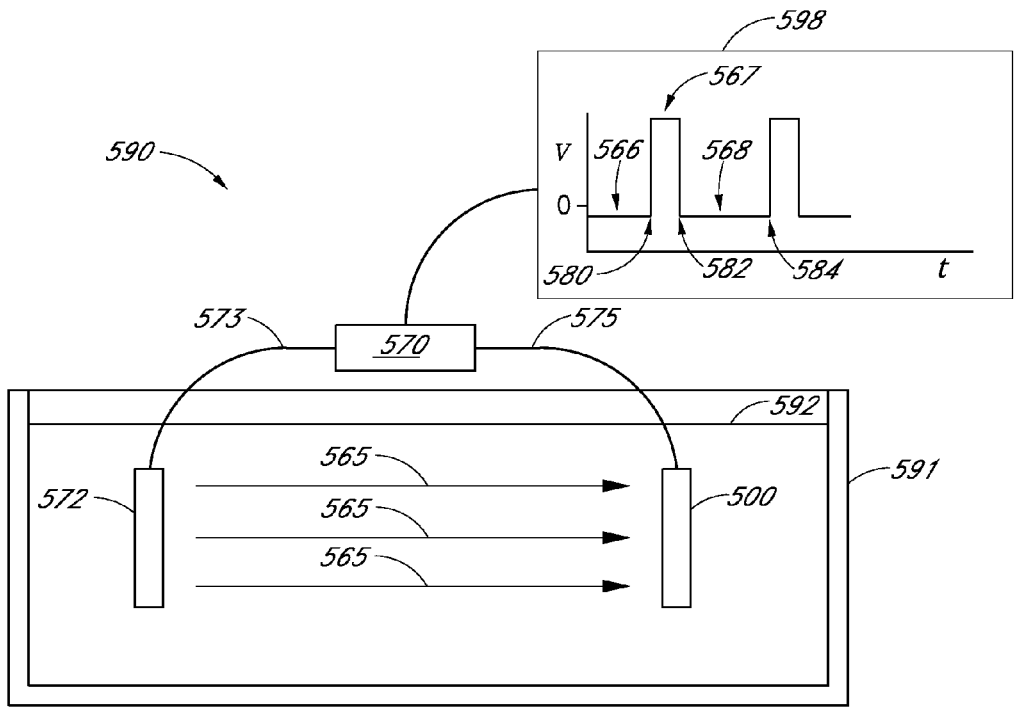

With reference to FIG. 28-30, another embodiment of the continued method of plating metal to the solar cell 500 is shown. The method can include providing a solar cell 500 with a deposited seed metal layer on a silicon substrate. The method can further include providing an electroplating setup 590 including an electroplating tank 591 to hold an electroplating bath 592. The electroplating configuration can further be made up of a first metal interconnect 575 and a second metal interconnect 573 submersed within the electroplating bath 592. A rectifier 570 can be coupled to the first and second metal interconnect 575, 573. The first metal interconnect 575 can be connected to the solar cell 500. The second metal interconnect 573 can be connected to a first metal 572. A voltage output display 598 can show the output voltage. As depicted in FIG. 28 a first metal layer can be plated on the solar cell 500, where plating the first metal layer is accomplished by conducting a first current 563 through the seed metal layer of the solar cell 500. The first current 563 can be conducted in a first direction at first voltage 566 for a first time 580. In FIG. 29, excess metal 538 can be ejected from the solar cell 500 by conducting a second current 564 through the solar cell 500 in a second direction, at a second voltage 567 for a second time 582. FIG. 30 depicts the combined process described in FIGS. 28 and 29, including conducting a third current 565 through the solar cell 500 in a first direction, at a third voltage 568 for a third time 584. The waveform shown within the voltage output display 598 shows an embodiment for plating metal on a solar cell 500 without plating metal along the solar cell edges, eliminating the need for the various standard edge coating, etching and protection methods described above. Alternating or varying between the voltages 566, 567, 568, currents 563, 564, 565 and durations 580, 582 and 584 in the above described manner can provide the necessary approach to only plate metal along the surface of the solar cell 500 without plating metal along the solar cell edges.

Figure 31:
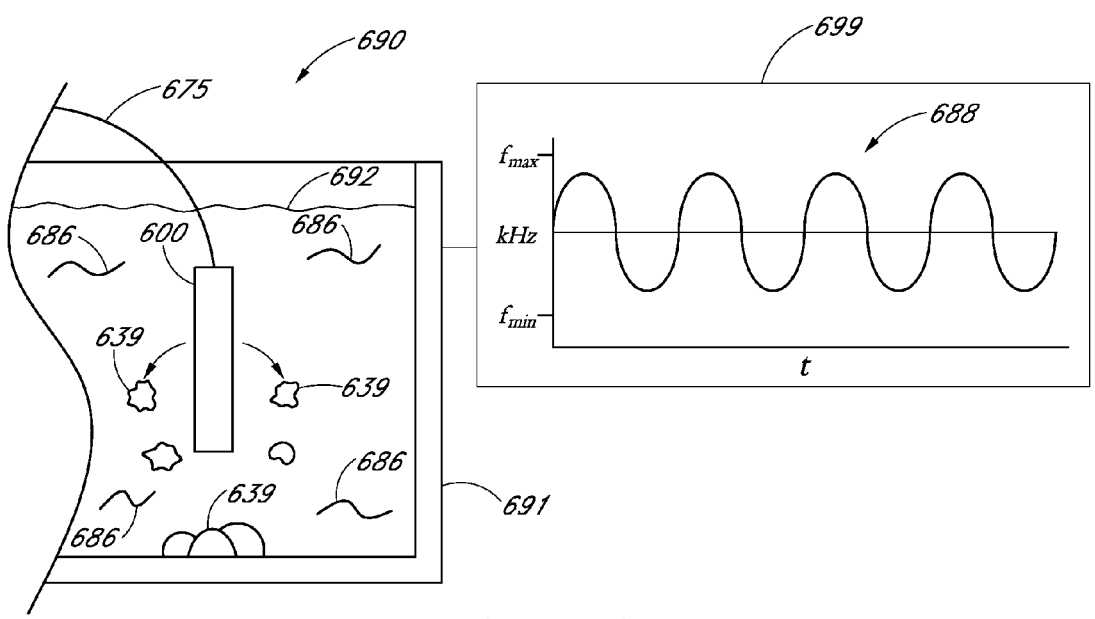

FIG. 31 illustrates a continuation of the method of plating metal to the solar cell 600. Subsequent to performing a plating process, such as the plating process described or various other standard plating processes, continuation to the method described above can further include performing an ultrasonic cleaning process to remove excess plated metals from the at least one side edge resulting from plating a metal layer on a solar cell 600. The method can include providing a solar cell 600 and an ultrasonic setup 690. The ultrasonic setup 690 can include use of an ultrasonic medium 692, an enclosure 691 to contain the ultrasonic medium 692 and an ultrasonic generator 699. The solar cell can be suspended by a suspension wire or interconnect 675. The ultrasonic cleaning process can be performed by submersing the solar cell within the ultrasonic medium 692 and vibrating 686 the ultrasonic medium 692 within frequency 688 to remove excess metal 639 from the solar cell 600. In an embodiment, the frequency 688 ranges between 20 to 400 kilohertz. In an embodiment, the ultrasonic medium 692 includes, but is not limited to, water, air, surfactant solutions, ionic solutions, acids and bases.

Figure 32:
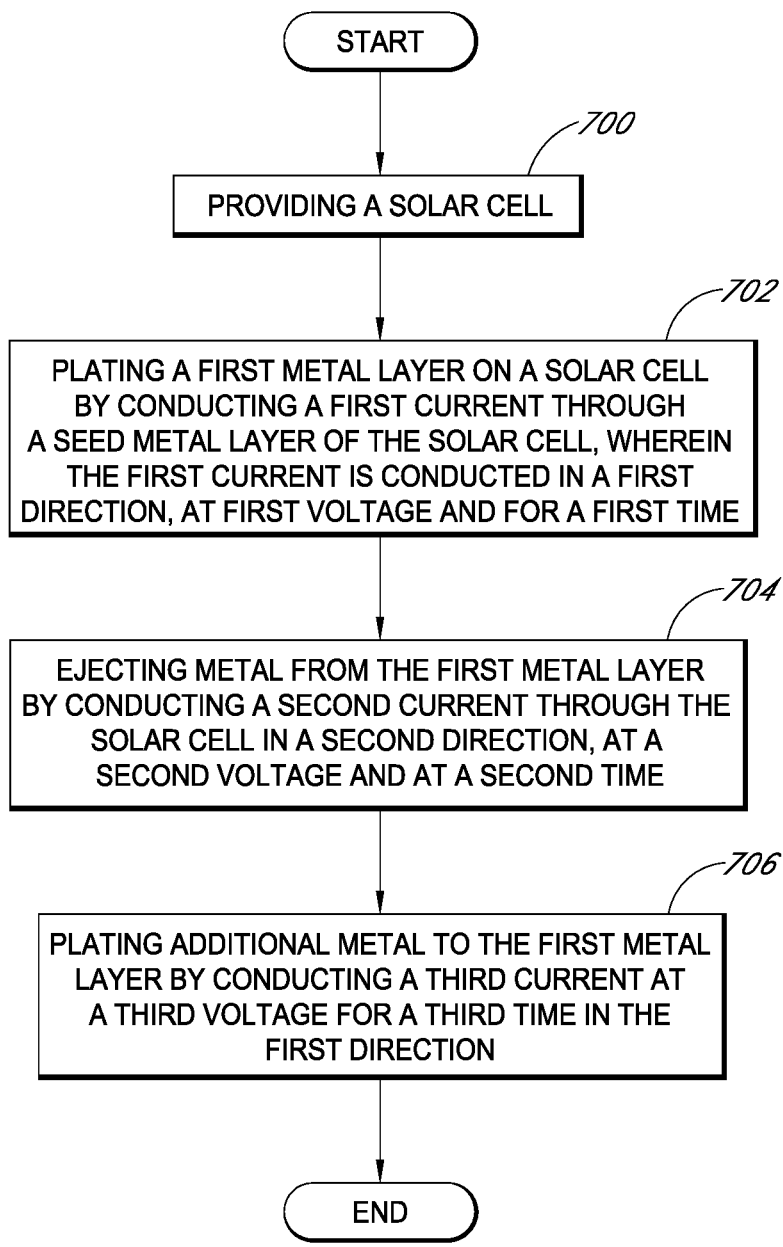
FIGS. 32-38 are flowchart representations of a solar cell being fabricated in accordance with an embodiment of the present inventions.

With reference to FIG. 32, a flow chart of an embodiment for plating metal to a solar cell 200 is shown. As described above, the first operation 700 can include providing a solar cell 200 having a front side 206 configured to face the sun during normal operation, a back side 208 opposite the front side, four side edges, and a seed metal layer 220 on a silicon 202 substrate of the solar cell 200. A second operation 702 can be to plate a first metal layer 230 on the solar cell, where plating the first metal layer 230 is accomplished by conducting a first current 260 through the seed metal layer 220 using a metal 272 in a bath and conducting the first current 260 in a first direction, at first voltage for a first time. The third operation 704 can be to eject metal 238 from the first metal layer 230 by conducting a second current 261 through the solar cell in a second direction at a second voltage and at a second time. The fourth operation 706 can be to subsequently plate additional metal to the first metal layer 230 by conducting a third current 262 at a third voltage for a third time in the first direction.

Figure 33A:
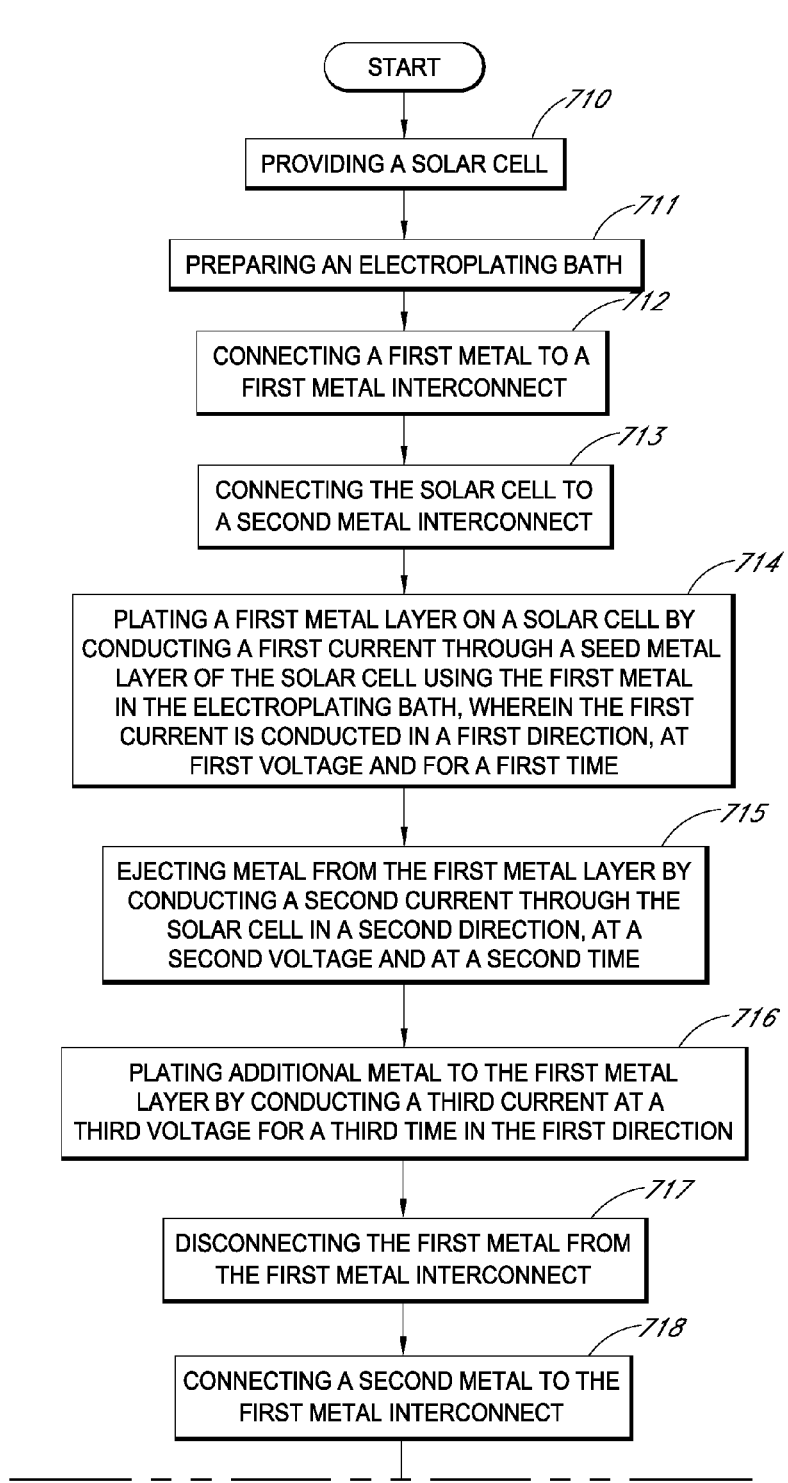
Figure 33B:
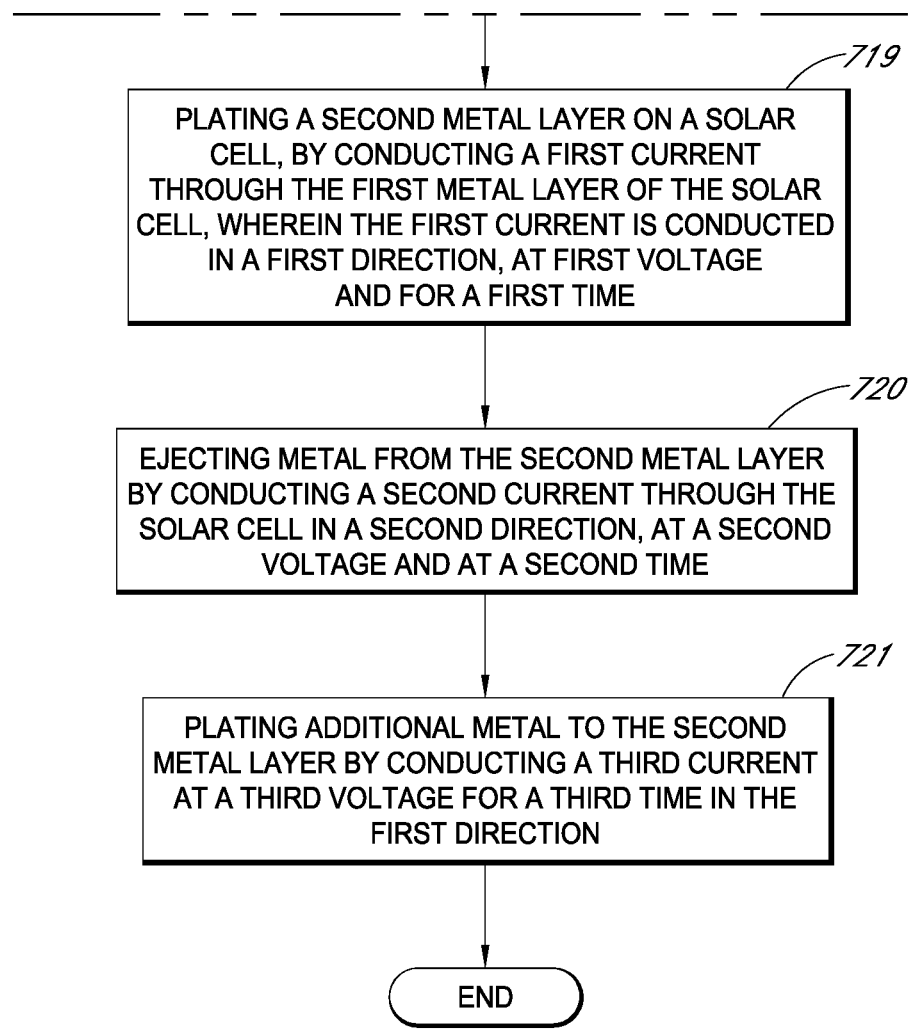

FIG. 33 illustrates a flow chart of another embodiment for plating metal to a solar cell 200 and 300. As described above, the first operation 710 can include providing a solar cell 300 with a seed metal layer 320 on a silicon substrate 302. The second operation 711 can be to prepare an electroplating bath. The third operation 712 can be to connect a first metal 372 to a first metal interconnect. The fourth operation 713 can be to connect a second metal interconnect to the solar cell 300. Both the first and second metal interconnect can be coupled to a rectifier. The fifth operation 714 can include plating a first metal layer on the solar cell 300, where plating the first metal layer 330 is accomplished by conducting a first current 360 through the seed metal layer 320 using the first metal 372 in the electroplating bath, conducting the first current 360 in a first direction, at first voltage and for a first time. The sixth operation 715 can be to eject metal 348 from the first metal layer 330 by conducting a second current 361 through the solar cell in a second direction, at a second voltage and at a second time. Subsequently the seventh operation 716 can include plating additional metal on the first metal layer 330 by conducting a third current 362 at a third voltage for a third time in the first direction. The eighth and ninth operations 717, 718 can include disconnecting the first metal 372 from the first metal interconnect where a second metal 374 can be subsequently connected to the first metal interconnect. The tenth operation 719 can include plating a second metal layer 340 on the solar cell 300 by conducting a first current 360 through the first metal layer 330, conducting the first current 360 in a first direction, at first voltage and for a first time. The eleventh operation 720 can include ejecting metal 348 from the second metal layer 340 by conducting a second current 361 through the solar cell 300 in a second direction, at a second voltage and at a second time. The last operation 721 can include plating additional metal to the second metal layer 340 by conducting a third current 362 at a third voltage for a third time in the first direction.

Figure 34:
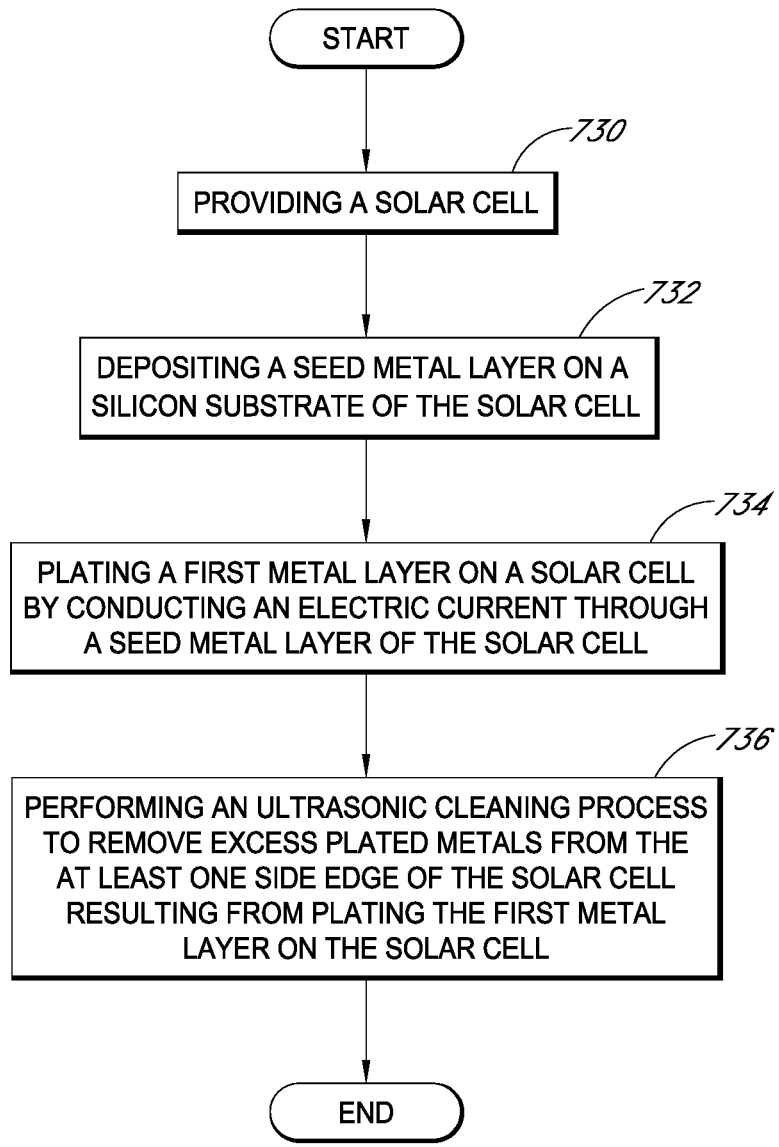

With reference to FIG. 34, a flow chart of yet another embodiment for plating metal to a solar cell 400 is shown. As described above, the first operation 730 can include providing a solar cell 400 having a front side 406 configured to face the sun during normal operation, a back side 408 opposite the front side and four side edges. The second operation 732 can include depositing a seed metal layer 420 on a silicon substrate 402 of the solar cell 400. The third operation 734 can include plating a first metal layer 430 on the solar cell 400 by conducting an electric current through a seed metal 420 layer of the solar cell 400. The last operation 736 can include subsequently performing an ultrasonic cleaning process to remove excess plated metals 439 from the at least one side edge resulting from plating a first metal layer 430 on the solar cell.

Figure 35:
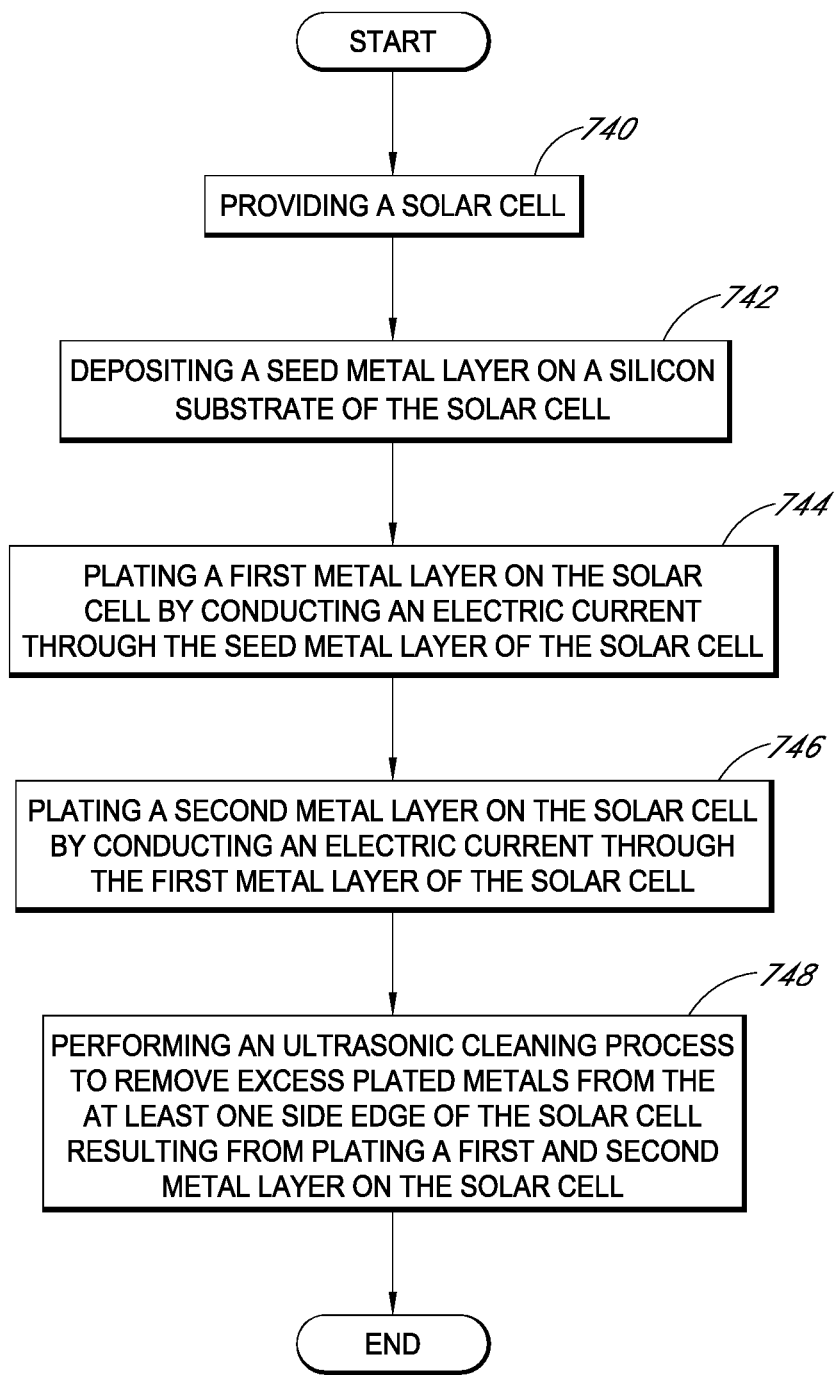

FIG. 35 illustrates a flow chart of still another embodiment for plating metal to a solar cell 400. As described above, the first operation 740 can providing a solar cell 400 having a front side 406 configured to face the sun during normal operation, a back side 408 opposite the front side and four side edges. The second operation 742 can include depositing a seed metal layer 420 on a silicon substrate 402 of the solar cell 400. The third operation 744 can include plating a first metal layer 430 on the solar cell 400 by conducting an electric current through a seed metal layer 420 of the solar cell. The fourth operation 746 can include plating a second metal layer 440 on the solar cell 400 by conducting an electric current through the first metal layer 420 of the solar cell 400. The last operation 748 can include subsequently performing an ultrasonic cleaning process to remove excess plated metals 439, 449 from the at least one side edge resulting from plating a first and second metal layer 430, 440 on the solar cell 400.

Figure 36:
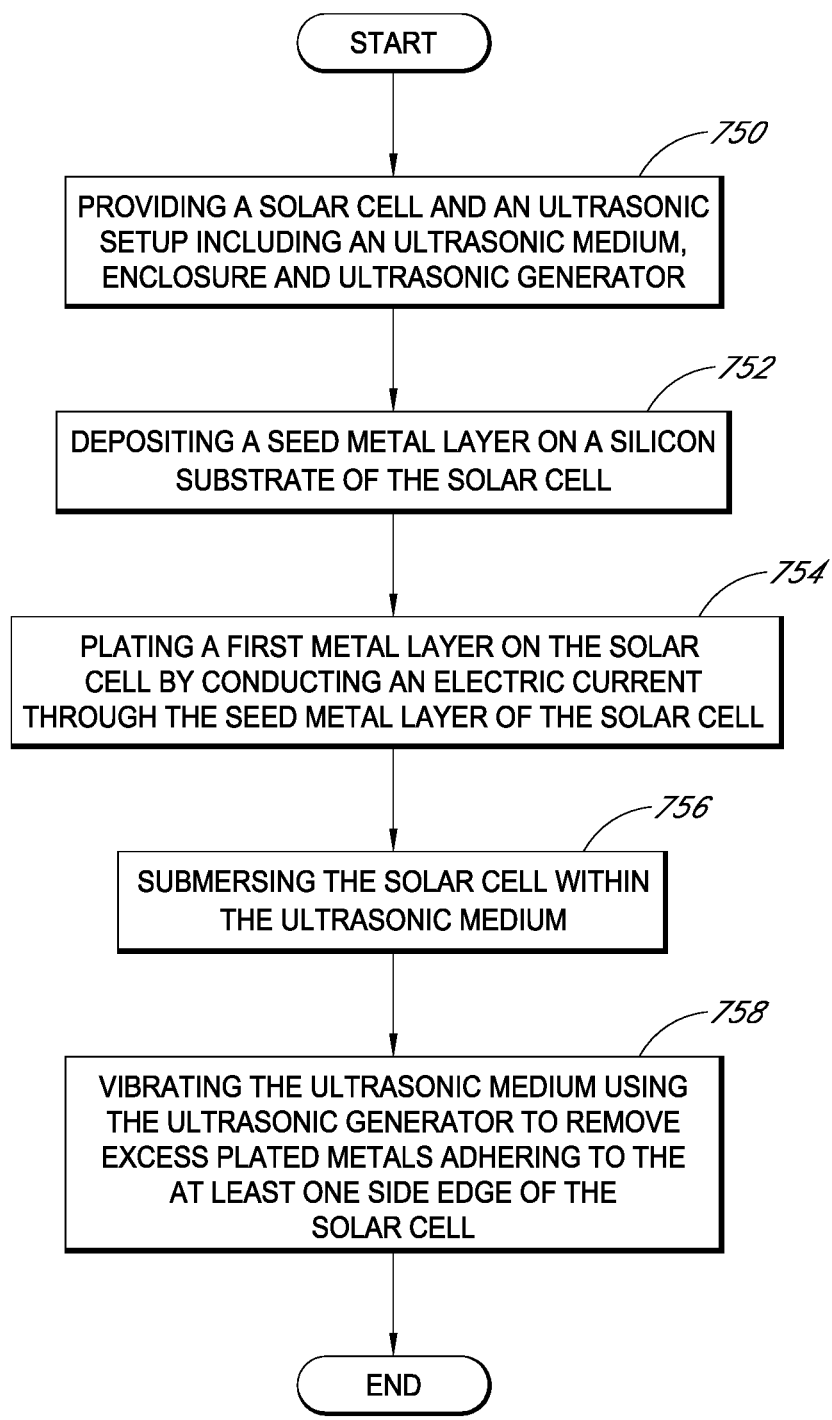

With reference to FIG. 36, a flow chart of yet another embodiment for plating metal to a solar cell 400 is shown. As described above, the first operation 750 can include providing a solar cell 400 having a front side 406 configured to face the sun during normal operation, a back side 408 opposite the front side 406 and four side edges and providing an ultrasonic setup 494 which includes an ultrasonic medium 496, an enclosure 495 to contain the ultrasonic medium 496 and an ultrasonic generator. The second operation 752 can include depositing a seed layer 420 on a silicon substrate 402 of the solar cell 400. The third operation 754 can include plating a first metal layer 430 on the solar cell 400 by conducting an electric current through a seed metal layer 420 of the solar cell 400. The fourth operation 756 can include submersing the solar cell 400 within the ultrasonic medium 496. The last operation 758 can include vibrating 486 the ultrasonic medium to remove excess plated metals 439, 449 adhering to the at least one side edge of the solar cell 400.

Figure 37:
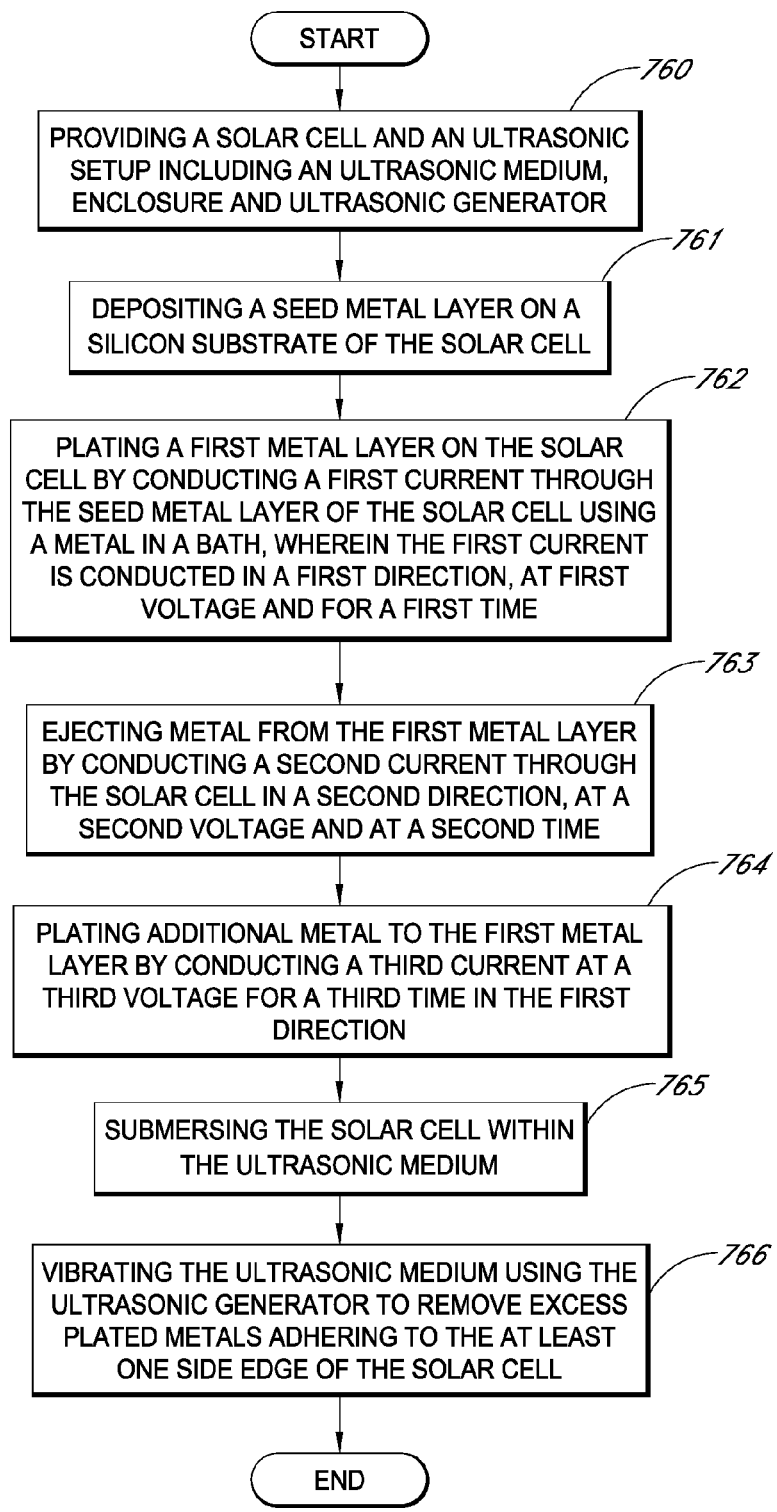

With reference to FIG. 37, a flow chart of yet another embodiment for plating metal to a solar cell 400 is shown. As described above, the first operation 760 can include providing a solar cell 400 having a front side 406 configured to face the sun during normal operation, a back side 408 opposite the front side 408 and four side edges and providing an ultrasonic setup 494 which includes an ultrasonic medium 496, an enclosure to contain the ultrasonic medium 396 and an ultrasonic generator. The second operation 761 can include depositing a seed layer 420 on a silicon substrate 402 of the solar cell 400. The third operation 762 can include plating a first metal layer 430 on a solar cell 400 by conducting a first current through the seed metal layer 420 of the solar cell using a metal in a bath, where the first current is conducted in a first direction, at first voltage and for a first time. The fourth operation 763 can include ejecting metal 439, 449 from the first metal layer 430 by conducting a second current through the solar cell 400 in a second direction, at a second voltage and at a second time. The fifth operation 764 can include plating additional metal to the first metal layer 430 by conducting a third current at a third voltage for a third time in the first direction. The sixth operation 765 can include submersing the solar cell 400 within the ultrasonic medium 496. The seventh and last operation 766 can include vibrating 486 the ultrasonic medium to remove excess plated metals 439, 449 adhering to the at least one side edge of the solar cell.

Figure 38B:
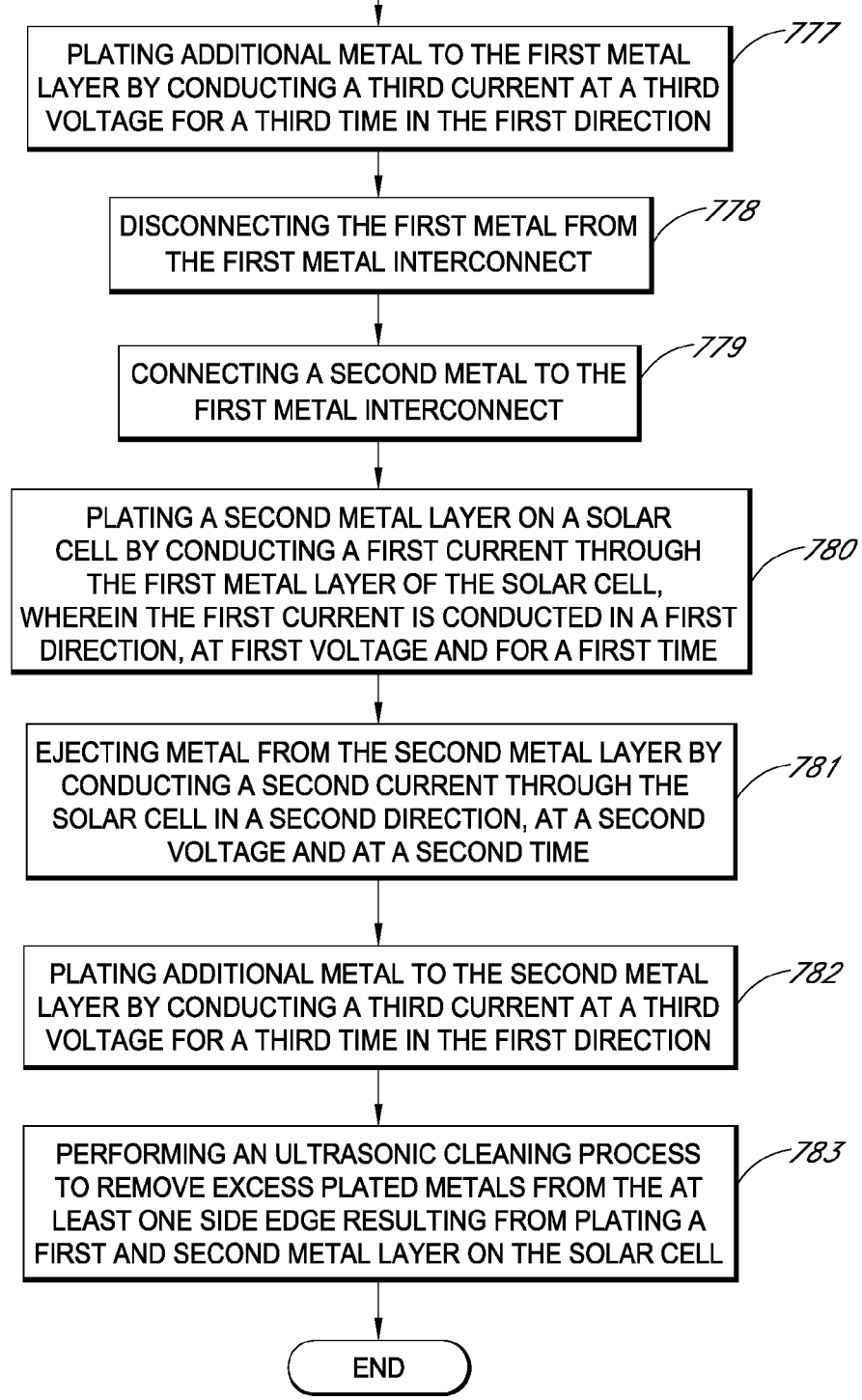

FIG. 38 illustrates a flow chart of another embodiment for plating metal to a solar cell 200, 300 and 400. As described above, the first operation 770 can include providing a solar cell 400. The second operation 771 can include depositing a seed metal layer 420 on a silicon substrate of the solar cell 400. The third operation 772 can be to prepare an electroplating bath, including an electrolyte solution, a first metal interconnect and a second metal interconnect submersed within the electroplating bath and coupled to a rectifier. The fourth operation 773 can be to connect a first metal to a first metal interconnect. The fifth operation 774 can be to connect a second metal interconnect to the solar cell 400. Both the first and second metal interconnect can be coupled to a rectifier. The sixth operation 775 can include plating a first metal layer on the solar cell 400, where plating the first metal layer 430 is accomplished by conducting a first current through the seed metal layer 420 using the first metal in the electroplating bath, and conducting the first current in a first direction, at first voltage and for a first time. The seventh operation 776 can be to eject metal 439, 449 from the first metal layer 430 by conducting a second current through the solar cell in a second direction, at a second voltage and at a second time. Subsequently the eighth operation 777 can include plating additional metal to the first metal layer 430 by conducting a third current at a third voltage for a third time in the first direction. The ninth and tenth operations 778, 779 can include disconnecting the first metal from the first metal interconnect where a second metal can be subsequently connected to the first metal interconnect. The eleventh operation 780 can include plating a second metal layer 440 on the solar cell by conducting a first current through the first metal layer 430, conducting the first current in a first direction, at first voltage and for a first time. The twelfth operation 781 can include ejecting metal 439, 449 from the second metal layer 440 by conducting a second current through the solar cell in a second direction, at a second voltage and at a second time. The thirteenth operation 782 can include plating additional metal to the second metal layer 440 by conducting a third current at a third voltage for a third time in the first direction. The last operation 783 can include performing an ultrasonic cleaning process to remove excess plated metals 439, 449 from at least one side edge resulting from plating a first and a second metal layer 430, 440 on the solar cell 400.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of plating a metal layer on a solar cell, the solar cell having a front side configured to face the sun during normal operation, a back side opposite the front side, and four side edges, the method comprising:

plating a first metal layer on a solar cell, wherein the solar cell comprises a seed metal layer on a silicon substrate, wherein plating a first metal layer comprises conducting a first current through a seed metal layer of the solar cell using a metal electrode in an electroplating bath, wherein the first current is conducted in a first direction, at a first voltage and for a first time;

ejecting metal from the first metal layer by conducting a second current through the solar cell in a second direction, at a second voltage and at a second time; and subsequent to the ejecting metal from the first metal layer, plating additional metal to the first metal layer by conducting a third current at a third voltage for a third time in the first direction.

2. The method of claim 1 wherein the ejecting metal from the first metal layer further comprises disproportionately removing metal from at least one of the four side edges of the solar cell compared to metal removed from the back side of the solar cell.

3. The method of claim 1 wherein the ejecting metal from the first metal layer further comprises disproportionally removing metal from at least one of the four side edges of the solar cell compared to metal removed from the back side of the solar cell without removing metal from the seed metal layer.

4. The method of claim 1 wherein the plating and the ejecting operations are alternated throughout the plating process.

5. The method of claim 1, wherein the second time is shorter than the first time.

6. The method of claim 1, wherein the second voltage is at most 3 times greater than that of the first voltage.

7. The method of claim 1, wherein the step of plating the first metal layer further comprises plating the first metal layer on at least one of the four side edges of the solar cell with a thickness of less than approximately 1 micrometer.

8. The method of claim 1 further comprising:

preparing the electroplating bath comprising an electrolyte solution with a portion of a first metal interconnect and a second metal interconnect submersed within the electroplating bath and another portion of the first metal interconnect and the second metal interconnect coupled to a rectifier;

connecting the metal electrode to the first metal interconnect; connecting the solar cell to the second metal interconnect to provide for the plating of the first metal layer on the solar cell;

subsequent to the step of plating additional metal to the first metal layer, disconnecting the metal electrode from the first metal interconnect; connecting a second meta electrode to the first metal interconnect; and plating a second metal layer on the solar cell, wherein the solar cell comprises the first metal layer on the seed metal layer, wherein plating the second metal layer comprises conducting a fourth current through the first metal layer of the solar cell, wherein the fourth current is conducted in the first direction, at a fourth voltage and for a fourth time;

ejecting metal from the second metal layer by conducting a fifth current through the solar cell in the second direction, at a fifth voltage and at a fifth time; and, subsequent to the ejecting metal from the second metal layer, plating additional metal to the second metal layer by conducting a sixth current at a sixth voltage for a sixth time in the first direction.

9. The method of claim 8, wherein the plating the first and second metal layer comprises plating a first and second metal selected from the group containing copper, tin, aluminum, silver, gold, chromium, iron, nickel, zinc, ruthenium, palladium, and platinum.

10. A method of plating a metal layer on a solar cell, the solar cell having a front side configured to face the sun during normal operation, a back side opposite the front side, and four side edges, the method comprising:

depositing a seed metal layer on a silicon substrate of the solar cell;

plating a first metal layer on the solar cell, wherein the plating of the first metal layer comprises conducting an electric current through the seed metal layer of the solar cell; and performing an ultrasonic cleaning process to remove excess plated metal from at least one of the four side edges of the solar cell resulting from the step of plating the first metal layer on the solar cell.

11. The method of claim 10, wherein the plating the metal layer on the solar cell further comprises:

plating a second metal layer on the solar cell, wherein the plating the second metal layer comprises conducting an electric current through the first metal layer of the solar cell.

12. The method of claim 10, wherein the depositing the seed metal layer on the silicon substrate of the solar cell comprises depositing the seed metal layer through a physical vapor deposition (PVD) process.

13. The method of claim 10, wherein the depositing the seed metal layer on the silicon substrate of the solar cell comprises depositing the seed metal layer through a pattern-print deposition process.

14. The method of claim 10, wherein the depositing the seed metal layer comprises depositing a metal selected from the group containing copper, tin, tungsten, titanium, titanium tungsten, silver, gold, titanium nitride, tantalum nitride, ruthenium and platinum.

15. The method of claim 10, wherein the performing an ultrasonic cleaning process comprises:

submersing the solar cell within an ultrasonic medium; and vibrating the ultrasonic medium using an ultrasonic generator to remove the excess plated metals adhering to at least one of the four side edges of the solar cell.

16. The method of claim 15, wherein the ultrasonic medium comprises a medium selected from the group consisting of water, air, surfactant solutions, ionic solutions, acids and bases.

17. The method of claim 15, wherein the vibrating the ultrasonic medium comprises vibrating the ultrasonic medium within a frequency range of 20 to 400 kilohertz.

18. The method of claim 10, wherein the plating the first metal layer on the solar cell further comprises:

the plating of the first metal layer on the solar cell by conducting a first current through the seed metal layer of the solar cell using a metal electrode in an electroplating bath, wherein the first current is conducted in a first direction, at a first voltage and for a first time;

ejecting metal from the first metal layer by conducting a second current through the solar cell in a second direction, at a second voltage and at a second time; and subsequent to the ejecting metal from the first metal layer, plating additional metal to the first metal layer by conducting a third current at a third voltage for a third time in the first direction.

19. A method of plating a metal layer on a solar cell, the solar cell having a front side configured to face the sun during normal operation, a back side opposite the front side, and four side edges, the method comprising:

depositing a seed metal layer on a silicon substrate of the solar cell;

preparing an electroplating bath comprising an electrolyte solution with a portion of a first metal interconnect and a second metal interconnect submersed within the electroplating bath and another portion of the first metal interconnect and second metal interconnect coupled to a rectifier;

connecting a first metal electrode to the first metal interconnect; connecting the solar cell to the second metal interconnect; and plating a first metal layer on the solar cell, wherein the plating the first metal layer comprises conducting a first current through the seed metal layer of the solar cell, wherein the first current is conducted in a first direction, at a first voltage and for a first time;

ejecting metal from the first metal layer by conducting a second current through the solar cell in a second direction, at a second voltage and at a second time; and, subsequent to the ejecting metal from the first metal layer, plating additional metal to the first metal layer by conducting a third current at a third voltage for a third time in the first direction;

disconnecting the first metal electrode from the first metal interconnect; connecting a second metal electrode to the first metal interconnect; and plating a second metal layer on the solar cell, wherein the solar cell comprises the first metal layer disposed over the seed layer on the silicon substrate, wherein the plating the second metal layer comprises conducting a fourth current through the first metal layer of the solar cell, wherein the fourth current is conducted in the first direction, at a fourth voltage and for a fourth time;

ejecting metal from the second metal layer by conducting a fifth current through the solar cell in the second direction, at a fifth voltage and at a fifth time; and, subsequent to ejecting metal from the second metal layer, plating additional metal to the second metal layer by conducting a sixth current at a sixth voltage for a sixth time in the first direction; and performing an ultrasonic cleaning process to remove excess plated metal from at least one of the four side edges resulting from the plating the first metal layer on the solar cell.

* * * * *